United States Patent
Chae

(10) Patent No.: US 10,347,305 B2
(45) Date of Patent: Jul. 9, 2019

(54) MEMORY DEVICE FOR PERFORMING LATCH OPERATION AND METHOD FOR OPERATING THE SAME

(71) Applicant: SK hynix Inc., Gyeonggi-do (KR)

(72) Inventor: Kyeong Min Chae, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/850,713

(22) Filed: Dec. 21, 2017

(65) Prior Publication Data

US 2018/0336936 A1    Nov. 22, 2018

(30) Foreign Application Priority Data

May 17, 2017  (KR) ........................ 10-2017-0061242

(51) Int. Cl.
| G11C 7/10 | (2006.01) |
| G11C 16/26 | (2006.01) |
| G11C 16/08 | (2006.01) |
| G11C 16/12 | (2006.01) |
| G11C 7/22 | (2006.01) |

(52) U.S. Cl.
CPC ............ *G11C 7/1057* (2013.01); *G11C 7/106* (2013.01); *G11C 7/1039* (2013.01); *G11C 7/1063* (2013.01); *G11C 7/1066* (2013.01); *G11C 7/222* (2013.01); *G11C 16/08* (2013.01); *G11C 16/12* (2013.01); *G11C 16/26* (2013.01); *G11C 7/1069* (2013.01)

(58) Field of Classification Search
CPC ..... G11C 7/1057; G11C 16/12; G11C 7/1069; G11C 7/1063; G11C 7/106; G11C 16/26; G11C 16/08
See application file for complete search history.

(56) References Cited

U.S. PATENT DOCUMENTS

| 9,412,456 B2 * | 8/2016 | Kwak ................. H01L 27/1157 |
| 2013/0124783 A1 * | 5/2013 | Yoon .................. G06F 12/0246 |
| | | 711/103 |
| 2013/0135942 A1 * | 5/2013 | Jeong .................. G11C 7/1039 |
| | | 365/189.05 |

FOREIGN PATENT DOCUMENTS

KR    1020130059911    6/2013

* cited by examiner

*Primary Examiner* — David Lam
(74) *Attorney, Agent, or Firm* — IP & T Group LLP

(57) ABSTRACT

A memory device includes a page buffer group configured to read normal data stored in a memory cell array, a control logic configured to store logic data, and a pipe latch control unit configured to latch the normal data outputted from the page buffer group in synchronization with a read enable pipe signal and latch the logic data outputted from the control logic in synchronization with the read enable pipe signal.

19 Claims, 14 Drawing Sheets

MEMORY DEVICE FOR PERFORMING LATCH OPERATION AND METHOD FOR OPERATING THE SAME

CROSS-REFERENCE TO RELATED APPLICATION

The present application claims priority under 35 U.S.C. § 119(a) to Korean patent application number 10-2017-0061242 filed on May 17, 2017, the entire disclosure of which is herein incorporated by reference.

BACKGROUND

Field of Invention

Various embodiments of the present disclosure generally relate to a memory device and a method for operating the memory device, and more particularly, to a data output path for a data output operation of a memory device and a control method therefor.

Description of Related Art

A memory device may include a plurality of memory cells coupled to a single word line, and individual memory cells may be coupled to page buffers through bit lines. The memory device may perform a read operation and a data output operation that sense and temporarily store normal data, stored in the memory cells, using page buffers that output the stored data.

Further, the memory device may include a plurality of registers and may store logic data about the operating conditions of the memory device in the registers. Furthermore, the logic data stored in the registers may be outputted in response to an external command.

Recently, a high-speed data input/output operation is required in memory devices, since when an error in a data output operation is incurred, the reliability of memory devices deteriorates.

SUMMARY

Various embodiments of the present disclosure are directed to a memory device that is capable of improving the reliability of the memory device and a method for operating the memory device.

An embodiment of the present disclosure may provide for a memory device. The memory device may include a page buffer group configured to read normal data stored in a memory cell array, a control logic configured to store logic data, and a pipe latch control unit configured to latch the normal data outputted from the page buffer group in synchronization with a read enable pipe signal, and latch the logic data outputted from the control logic in synchronization with the read enable pipe signal.

An embodiment of the present disclosure may provide for a memory system. The memory system may include a memory device configured to output normal data and logic data, and a memory controller configured to output a read enable signal. The memory device may include a page buffer group configured to read the normal data from a memory cell array, a control logic configured to store the logic data, an input/output circuit configured to generate a read enable pipe signal in synchronization with the read enable signal, and a pipe latch control unit configured to latch the normal data outputted from the page buffer group and the logic data outputted from the control logic in synchronization with the read enable pipe signal. The input/output circuit further outputs the normal data in synchronization with a rising edge and a falling edge of the read enable pipe signal, and the input/output circuit further outputs the logic data in synchronization with either the rising edge or the falling edge of the read enable pipe signal.

An embodiment of the present disclosure may provide for a method for operating a memory device. The method may include latching normal data outputted from a memory cell array in response to a read enable pipe signal including a plurality of pulses, activating a read enable signal, activating the read enable pipe signal in synchronization with the read enable signal, and outputting the normal data to an outside at a double data rate in synchronization with the read enable signal, latching logic data outputted from a control logic in response to a logic data pipe input signal, and outputting the logic data to an outside at a single data rate in synchronization with the read enable signal.

DETAILED DESCRIPTION

Figure 1:
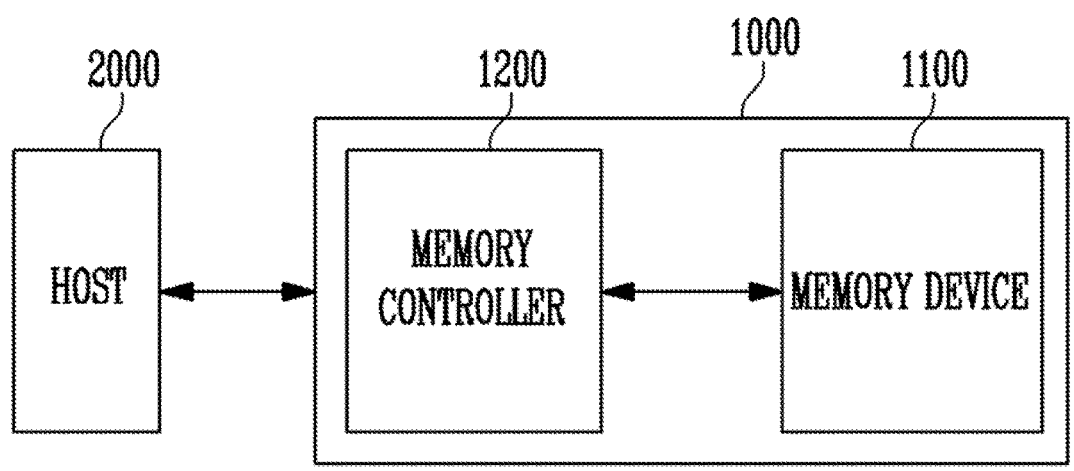
FIG. 1 is a diagram illustrating a memory system according to an embodiment of the present disclosure.

Example embodiments will now be described more fully hereinafter with reference to the accompanying drawings;

however, the examples may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments and intermediate structures. As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural form as long as it is not specifically mentioned in a sentence. Furthermore, "Include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a diagram illustrating a memory system according to an embodiment of the present disclosure.

Referring to FIG. 1, a memory system 1000 may include a memory device 1100 for storing data and a memory controller 1200 for controlling the memory device 1100 under the control of a host 2000.

The host 2000 may communicate with the memory system 1000 using an interface protocol such as a peripheral component interconnect-express (PCIe), an advanced technology attachment (ATA), a serial ATA (SATA), a parallel ATA (PATA) or a serial attached SCSI (SAS). In addition, the interface protocol provided for the purpose of data communication between the host 2000 and the memory system 1000 is not limited to the above examples and may be an interface protocol such as a Universal Serial Bus (USB), a Multi-Media Card (MMC), an Enhanced Small Disk Interface (ESDI), or Integrated Drive Electronics (IDE).

The memory controller 1200 may control overall operation of the memory system 1000 and may control data exchange between the host 2000 and the memory device 1100. For example, the memory controller 1200 may program or read data by controlling the memory device 1100 in response to a request from the host 2000. Further, the memory controller 1200 may store information of main memory blocks and sub-memory blocks included in the memory device 1100, and may select the memory device 1100 so that a program operation is performed on a main memory block or a sub-memory block depending on the amount of data that is loaded for the program operation. In an embodiment, the memory device 1110 may include a double data rate synchronous dynamic random access memory (DDR SDRAM), a low power DDR SDRAM fourth generation (LPDDR4 SDRAM), a graphics double data rate SDRAM (GDDR SDRAM), a low power DDR (LPDDR), a Rambus dynamic random access memory (RDRAM) or a flash memory.

The memory device 1100 may perform a program operation, a read operation or an erase operation under the control of the memory controller 1200.

The memory controller 1200 may set an operating condition by inputting data to the memory device 1100. Such a setting operation is typically referred to as a "set feature" or "mode registering setting". The memory device 1100 may include one or more registers and may store inputted data in the registers under the control of the memory controller 1200. Such data is typically referred to as "logic data" so that it is distinguished from normal data stored in a memory cell array. The logic data may contain operating condition information. The memory device 1100 may read and output the logic data stored in the registers in response to a command from the memory controller 1200. Such a command is typically referred to as a "logic data output command" or "get feature command", and such an operation is referred to as a "get feature operation". The memory controller 1200 may determine the operating condition of the memory device 1100 based on the logic data outputted from the memory device 1100.

Figure 2:
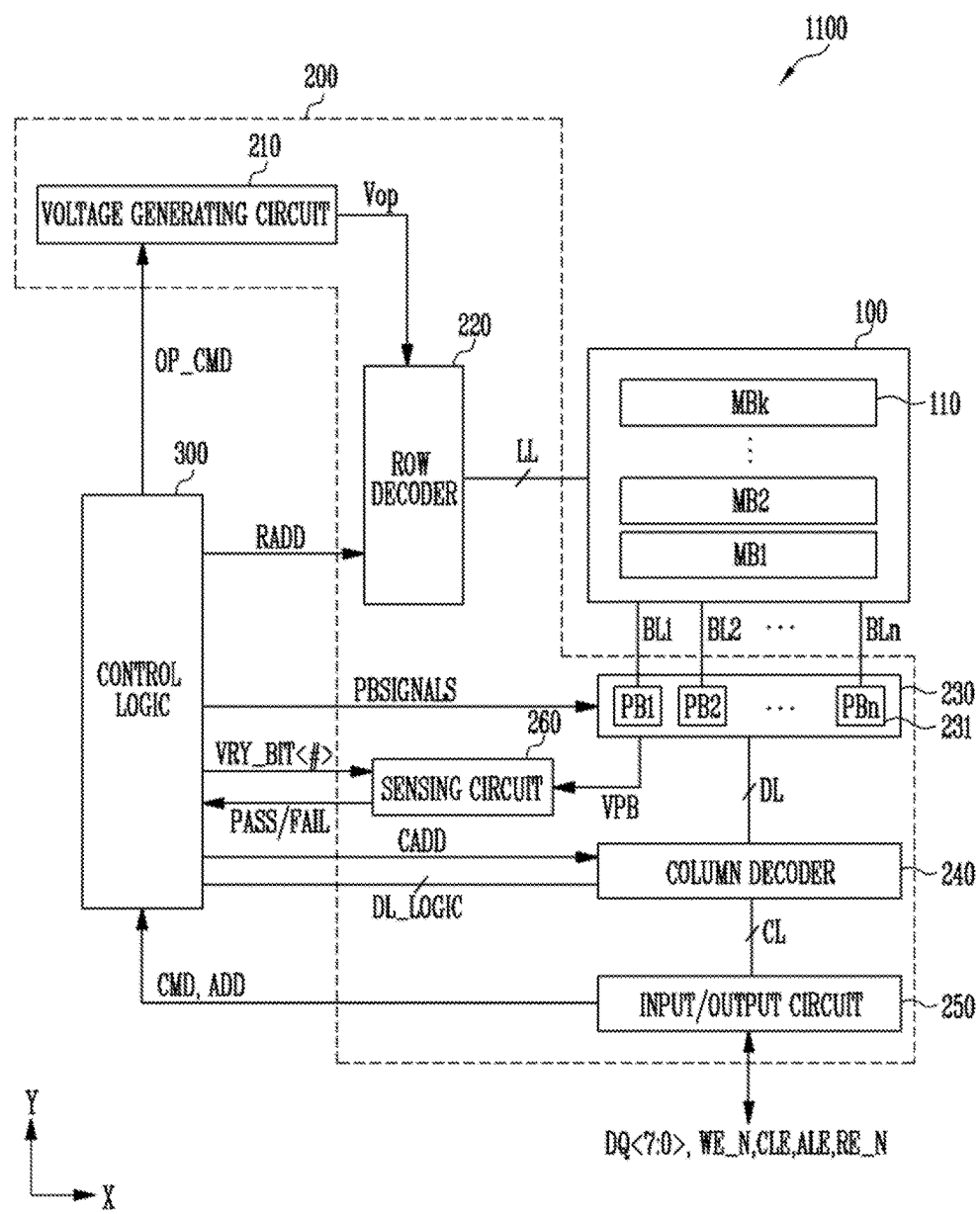
FIG. 2 is a diagram illustrating a memory device shown in FIG. 1.

FIG. 2 is a diagram illustrating the memory device of FIG. 1.

Referring to FIG. 2, the memory device 1100 may include a memory cell array 100 in which data is stored. Such data may typically be referred to as "normal data" so that it is distinguished from the above-described logic data. The memory device 1100 may also include peripheral circuits 200, which perform a program operation for storing data in the memory cell array 100, a read operation for outputting stored data, and an erase operation for erasing stored data. The memory device 1100 may include a control logic 300, which controls the peripheral circuits 200 under the control of a memory controller, for example, 1120 of FIG. 1.

The memory cell array 100 may include a plurality of memory blocks MB1 to MBk 110, where k is a positive integer. Local lines LL and bit lines BL1 to BLn, where n is a positive integer, may be coupled to each of the memory blocks MB1 to MBk 110. For example, the local lines LL may include a first select line, a second select line, and a plurality of word lines arranged between the first and second select lines. Further, the local lines LL may include dummy lines arranged between the first select line and the word lines, and between the second select line and the word lines. The first select line may be a source select line, and the second select line may be a drain select line. For example, the local lines LL may include word lines, drain and source select lines, and source lines. For example, the local lines LL may further include dummy lines. For example, the local lines LL may further include pipelines. The local lines LL may be coupled to the memory blocks MB1 to MBk 110, respectively, and the bit lines BL1 to BLn may be coupled in common to the memory blocks MB1 to MBk 110. The memory blocks MB1 to MBk 110 may be implemented as a two-dimensional (2D) or a three-dimensional (3D) structure. For example, the memory cells in the memory blocks 110 having a 2D structure may be arranged horizontally on a substrate. For example, memory cells in the memory blocks 110 having a 3D structure may be stacked vertically on the substrate.

The peripheral circuits 200 may be configured to perform a program, read or erase operation on a selected memory block 110 under the control of the control logic 300. For example, the peripheral circuits 200 may supply a verify voltage and pass voltages to the first select line, the second select line, and the word lines, may selectively discharge the first select line, the second select line, and the word lines, and may verify memory cells coupled to a word line selected from among the word lines, under the control of the control logic 300. For example, the peripheral circuits 200 may include a voltage generating circuit 210, a row decoder 220, a page buffer group 230, a column decoder 240, an input/output circuit 250, and a sensing circuit 260.

The voltage generating circuit 210 may generate various operation voltages Vop used for program, read and erase operations in response to an operation signal OP_CMD. Further, the voltage generating circuit 210 may selectively discharge the local lines LL in response to the operation signal OP_CMD. For example, the voltage generating circuit 210 may generate a program voltage, a verify voltage, pass voltages, a turn-on voltage, a read voltage, an erase voltage, a source line voltage, etc. under the control of the control logic 300.

The row decoder 220 may transfer the operation voltages Vop to the local lines LL coupled to a selected memory block 110 in response to a row address RADD.

The page buffer group 230 may include a plurality of page buffers PB1 to PBn 231 coupled to the bit lines BL1 to BLn. The page buffers PB1 to PBn 231 may be operated in response to page buffer control signals PBSIGNALS. For example, the page buffers PB1 to PBn 231 may temporarily store data received through the bit lines BL1 to BLn or may sense the voltages or currents of the bit lines BL1 to BLn during a read or a verify operation.

The column decoder 240 may transfer data between the input/output circuit 250 and the page buffer group 230 in response to a column address CADD. For example, the column decoder 240 may exchange data with the page buffers 231 through data lines DL or may exchange data with the input/output circuit 250 through column lines CL.

The control logic 300 may include one or more registers. As described above, the registers may store logic data inputted by the memory controller 1200. The logic data may contain the operating condition information of the memory device 1100. The logic data may be transferred to the control logic 300 through logic data lines DL_LOGIC. The memory device 1100 may control the operation of the memory device based on the logic data.

The memory device 1100 may output logic data stored in the registers of the control logic 300 in response to a command inputted by the memory controller 1200. The logic data may be transferred to the column decoder 240 through the logic data lines DL_LOGIC and may then be outputted to the memory controller 1200.

The input/output circuit 250 may exchange data and addresses with the memory controller 1200 through data input/output lines DQ<7:0>. The input/output circuit 250 may receive a write enable signal WE_N, a command latch enable signal CLE, an address latch enable signal ALE, and a read enable signal RE_N from the memory controller 1200.

Referring to FIGS. 1 and 2, the memory controller 1200 may input a command to the memory device 1100 through the data input/output lines DQ<7:0> by activating the command latch enable signal CLE. Further, the memory controller 1200 may input an address to the memory device 1100 through the data input/output lines DQ<7:0> by activating the address latch enable signal ALE. The memory controller 1200 may input data to the memory device 1100 through the data input/output lines DQ<7:0> by activating the write enable signal WE_N. Further, the memory controller 1200 may control the memory device 1100 so that the memory device 1100 outputs data through the data input/output lines DQ<7:0> by activating or clocking the read enable signal RE_N.

The sensing circuit 260 may generate a reference current in response to an enable bit VRY_BIT<#> and may output a pass signal PASS or a fail signal FAIL by comparing a sensing voltage VPB, received from the page buffer group 230, with a reference voltage, generated based on the reference current, during the read operation or the verify operation.

The control logic 300 may control the peripheral circuits 200 by outputting the operation signal OP_CMD, the row address RADD, the page buffer control signals PBSIGNALS, and the enable bit VRY_BIT<#> in response to the command CMD and the address ADD. Further, the control logic 300 may determine whether a verify operation has passed or failed in response to a pass or fail signal PASS or FAIL.

Figure 3:
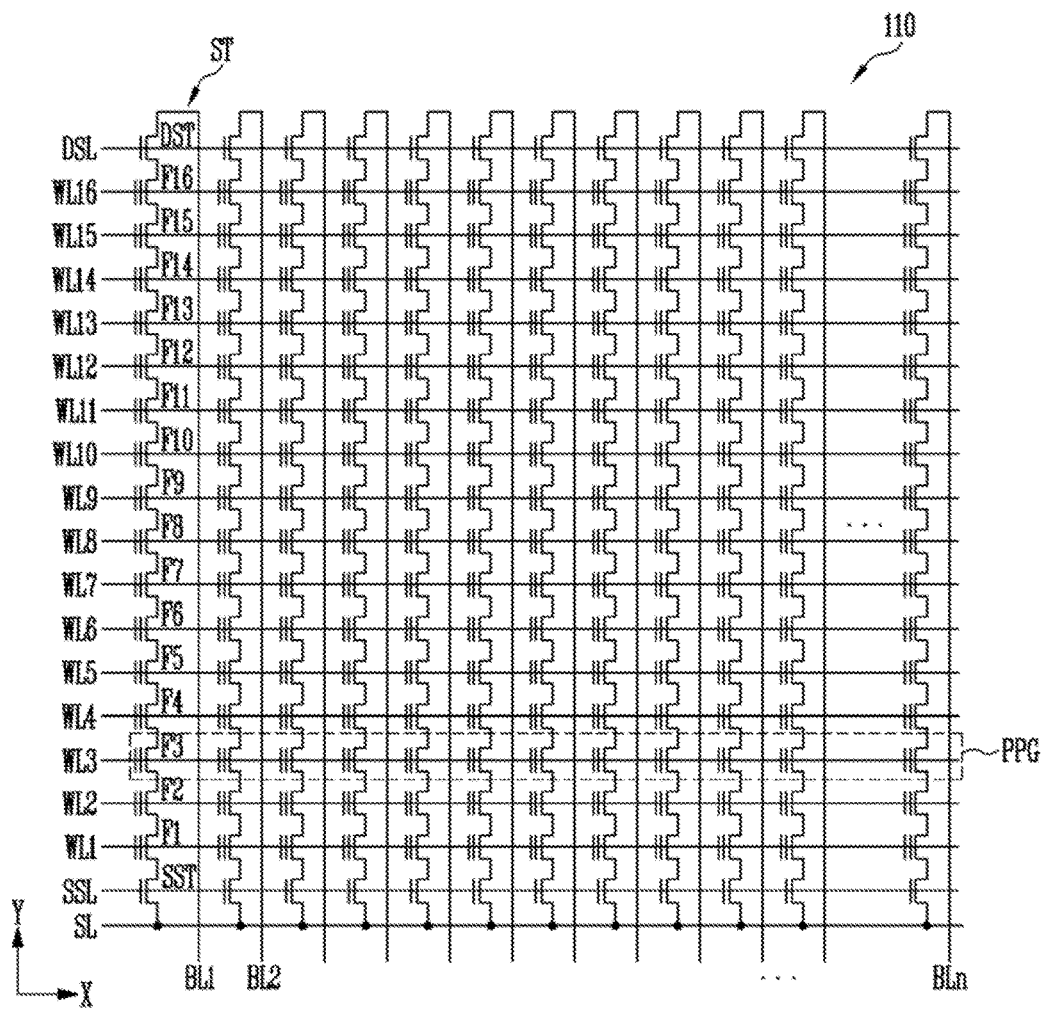
FIG. 3 is a diagram illustrating a memory block shown in FIG.

FIG. 3 is a diagram illustrating the memory block of FIG. 2.

Referring to FIG. 3, the memory block 110 may be configured such that a plurality of word lines, which are arranged in parallel, are coupled between a first select line and a second select line. Here, the first select line may be a source select line SSL and the second select line may be a drain select line DSL. In detail, the memory block 110 may include a plurality of strings ST coupled between bit lines BL1 to BLn and a source line SL. The bit lines BL1 to BLn may be respectively coupled to the strings ST, and the source line may be coupled in common to the strings ST. Since the strings ST may have the same configuration, a string ST coupled to the first bit line BL1 will be described in detail by way of example.

The string ST may include a source select transistor SST, a plurality of memory cells F1 to F16, and a drain select transistor DST, which are connected in series between the source line SL and the first bit line BL1. A single string ST may include one or more source select transistors SST and drain select transistors DST, and may include more memory cells than the memory cells F1 to F16 illustrated in the drawing.

A source of the source select transistor SST may be coupled to the source line SL and a drain of the drain select transistor DST may be coupled to the first bit line BL1. The memory cells F1 to F16 may be connected in series between the source select transistor SST and the drain select transistor DST. Gates of the source select transistors SST included in different strings ST may be coupled to a source select line SSL, gates of the drain select transistors DST may be coupled to a drain select line DSL, and gates of the memory cells F1 to F16 may be coupled to a plurality of word lines WL1 to WL16. A group of memory cells coupled to the same word line, among the memory cells included in different strings ST, may be referred to as a 'physical page (PPG)'. Therefore, a number of physical pages (PPG) that are identical to the number of word lines WL1 to WL16 may be included in the memory block 110.

A single memory cell (MC) may store 1-bit data. This is typically referred to as a "single-level cell (SLC)". In this case, a single physical page (PPG) may store data corresponding to a single logical page (LPG). The data corresponding to a single logical page (LPG) may include a number of data bits identical to the number of cells included in a single physical page (PPG). Further, a single memory cell (MC) may include two or more bits of data. This cell is typically referred to as a "multi-level cell (MLC)". Here, a single physical page (PPG) may store data corresponding to two or more logical pages (LPG).

Figure 4:
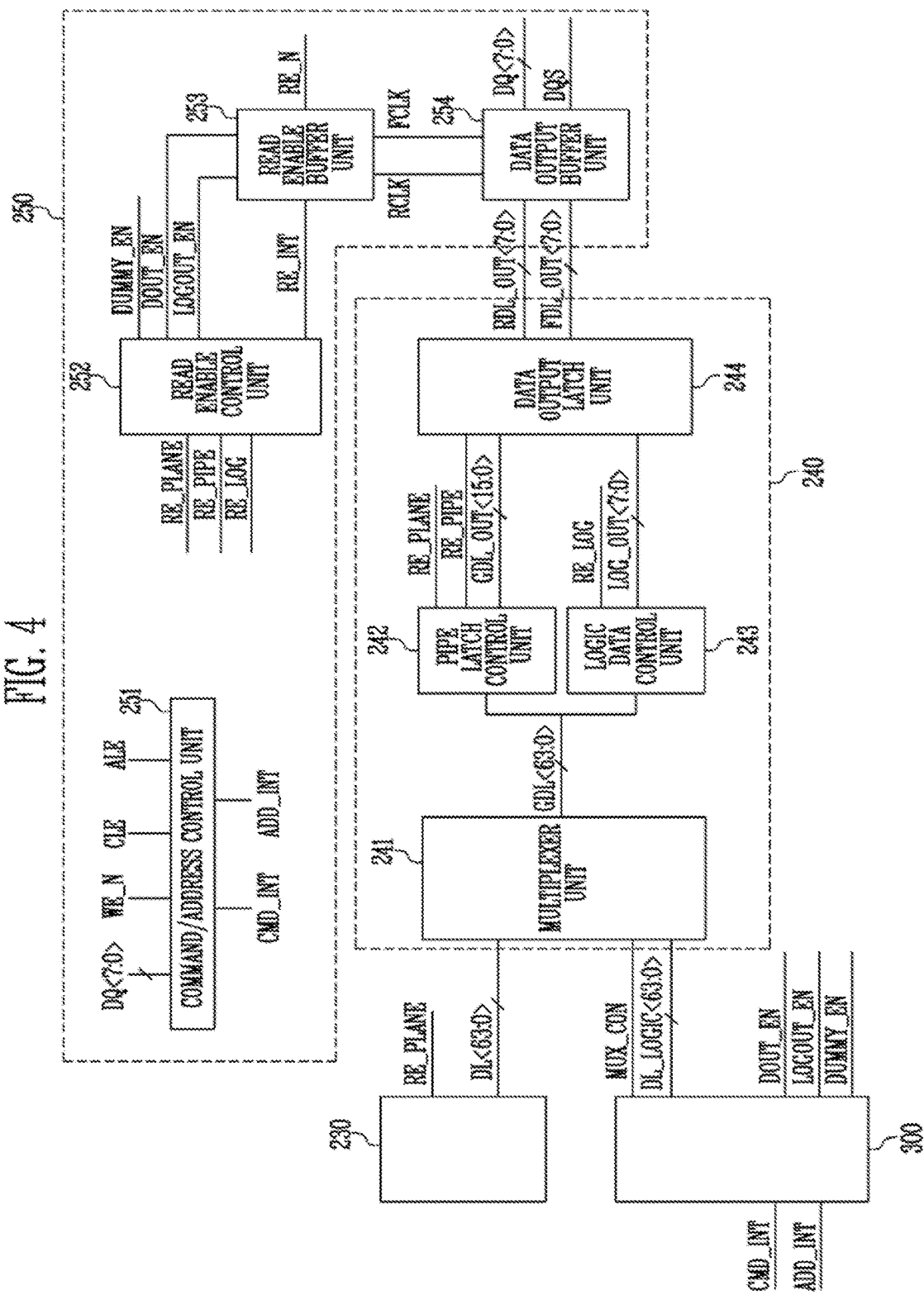
FIG. 4 is a diagram describing a data output path according to an embodiment of the present disclosure.

FIG. 4 is a diagram describing a data output path according to an embodiment of the present disclosure.

Referring to FIG. 4, the input/output circuit 250 may include a command/address control unit 251, a read enable control unit 252, a read enable buffer unit 253, and a data output buffer unit 254.

The command/address control unit 251 may communicate with an external device through data input/output lines DQ<7:0>, a write enable signal WE_N, a command latch enable signal CLE, and an address latch enable signal ALE. The command/address control unit 251 may receive data from the external device through the data input/output lines DQ<7:0> while the write enable signal WE_N is activated. The external device may be the memory controller 1200. Such data may be stored in the memory cell array 100 via the page buffer group 230. This data is typically called "normal data". Further, the command/address control unit 251 may receive a command from the external device through the data input/output lines DQ<7:0> while the command latch enable signal CLE is activated. The command may be a normal data output command for normal data output. Further, the command may be a logic data output command for logic data output. The logic data output command may be a get feature command. The command/address control unit 251 may generate an internal command signal CMD_INT in response to the received command. Also, the command/address control unit 251 may receive an address from the external device through the data input/output lines DQ<7:0> while the address latch enable signal ALE is activated. The command/address control unit 251 may generate an internal address signal ADD_INT based on the received address.

The read enable buffer unit 253 may generate an internal read enable signal RE_INT based on a read enable signal RE_N received from the external device. The read enable signal RE_N may be maintained at a specific value or may float during a period other than a data output period, and may be inputted in the form of a clock or a toggle during the data output period. That is, unlike typical system clocks, the read enable signal RE_N may be deactivated while the memory device 1100 performs a program or an erase operation, and may be activated during the data output period. The internal read enable signal RE_INT may be generated by delaying the read enable signal RE_N.

The control logic 300 may generate a logic data output enable signal LOGOUT_EN, a data output enable signal DOUT_EN, and a dummy data enable signal DUMMY_EN based on the internal command signal CMD_INT and the internal address signal ADD_INT generated by the command/address control unit 251.

The data output enable signal DOUT_EN may be activated while the data stored in the memory cell array 100 is outputted via the page buffer group 230. Hereinafter, the data stored in the memory cell array 100 will be referred to as "normal data". The normal data may be provided from a host 2000. That is, the data output enable signal DOUT_EN may be activated when a command is inputted from the external device for reading out the normal data from the memory cell array 100 through the page buffer group 230.

The logic data output enable signal LOGOUT_EN may be activated while data stored in the registers of the control logic 300 is outputted. Hereinafter, the data stored in the registers of the control logic 300 will be referred to as "logic data". That is, the logic data output enable signal LOGOUT_EN may be activated when a command is inputted from the external device for reading out the logic data from the control logic 300. This command may be referred to as a "logic data output command". Further, the logic data output command may be a get feature command, and the logic data stored in the control logic 300 may be operating condition information of the memory device 1100.

The read enable buffer unit 253 may generate a rising clock signal RCLK and a falling clock signal FCLK based on one or more of the read enable signal RE_N, the logic data output enable signal LOGOUT_EN, and the data output enable signal DOUT_EN that are inputted from the external device. The rising clock signal RCLK may be generated in synchronization with the rising edge of the read enable signal RE_N, and the falling clock signal FCLK may be generated in synchronization with the falling edge of the read enable signal RE_N. The rising clock signal RCLK and the falling clock signal FCLK may be used for a double data rate (DDR) operation. While the data output enable signal DOUT_EN is activated, both the rising clock signal RCLK and the falling clock signal FCLK may toggle in synchronization with the read enable signal RE_N, and the normal data may be outputted in synchronization with the rising clock signal RCLK and the falling clock signal FCLK. While the logic data output enable signal LOGOUT_EN is activated, only one of the rising clock signal RCLK and the falling clock signal FCLK may toggle in synchronization with the read enable signal RE_N and the other clock signal may not toggle. For example, while the logic data output enable signal LOGOUT_EN is activated, the rising clock signal RCLK may be activated in synchronization with the rising edge of the read enable signal RE_N and the falling clock signal FCLK may be deactivated. Consequently, the logic data may be outputted to the external device in synchronization with the rising clock signal RCLK. That is, the logic data may be outputted at single data rate (SDR).

The read enable control unit 252 may generate a read enable plane signal RE_PLANE, a read enable pipe signal RE_PIPE, and a read enable logic signal RE_LOG based on one or more of the internal read enable signal RE_INT, the logic data output enable signal LOGOUT_EN, the data output enable signal DOUT_EN, and the dummy data enable signal DUMMY_EN.

The read enable plane signal RE_PLANE and the read enable pipe signal RE_PIPE may be activated or generated in the form of continuous pulses while the dummy data enable signal DUMMY_EN is activated. Further, the read enable pipe signal RE_PIPE may be activated while the normal data stored in the memory cell array 100 is outputted to the external device through the page buffer group 230. Here, the read enable pipe signal RE_PIPE may be activated in synchronization with the internal read enable signal RE_INT.

The read enable logic signal RE_LOG may be activated while logic data stored in the control logic 300 is outputted. That is, the read enable logic signal RE_LOG may be activated in synchronization with the internal read enable signal RE_INT during which the logic data output enable signal LOGOUT_EN is activated.

The control logic 300 may generate a Multiplexer (MUX) signal MUX_CON based on the internal command signal CMD_INT and the internal address signal ADD_INT. The MUX signal MUX_CON may be activated while the logic data stored in the control logic 300 is outputted to the external device. The MUX signal MUX_CON may be activated when the logic data output command is inputted from the external device for reading out the logic data from the control logic 300. The MUX signal MUX_CON may indicate whether a data output operation is a normal data output operation or a logic data output operation.

The control logic 300 may output the logic data to a multiplexer unit 241 of the column decoder 240 through logic data lines DL_LOGIC<63:0> while the MUX signal MUX_CON is activated. The page buffer group 230 may output the normal data to the multiplexer unit 241 of the column decoder 240 through the data lines DL<63:0> in response to the read enable plane signal RE_PLANE.

The column decoder 240 may include the multiplexer unit 241, a pipe latch control unit 242, a logic data control unit 243, and a data output latch unit 244.

The multiplexer unit 241 may perform a multiplexing operation on the normal data, outputted from the page buffer group 230 through the data lines DL<63:0> or on logic data, outputted from the control logic 300 through the logic data lines DL_LOGIC<63:0>. Here, the multiplexer unit 241 may perform a multiplexing operation in response to the MUX signal MUX_CON. That is, when the MUX signal MUX_CON is activated, the multiplexer unit 241 transmits logic data from the logic data lines DL_LOGIC<63:0> to global data lines GDL<63:0>. When the MUX signal MUX_CON is deactivated, the multiplexer unit 241 may output the normal data from the data lines DL<63:0>, to the global data lines GDL<63:0>.

The pipe latch control unit 242 may receive the normal data from the multiplexer unit 241 through the global data lines GDL<63:0>. Further, the pipe latch control unit 242 may latch the normal data received from the multiplexer unit 241 in synchronization with the read enable pipe signal RE_PIPE, and may transmit the latched normal data to the data output latch unit 244 through the global data output lines GDL_OUT<15:0>.

The logic data control unit 243 may receive the logic data from the multiplexer unit 241 through the global data lines GDL<63:0>. Further, the logic data control unit 243 may transmit the logic data, received from the multiplexer unit 241, to the data output latch unit 244 through the logic data output lines LOG_OUT<15:0> in synchronization with the read enable logic signal RE_LOG.

The data output latch unit 244 may latch the normal data, received from the pipe latch control unit 242 through the global data output lines GDL_OUT<15:0>. Further, the data output latch unit 244 may transmit the latched normal data to the data output buffer unit 254 through rising edge synchronization data output lines RDL_OUT<7:0> and falling edge synchronization data output lines FDL_OUT<7:0>. The data output latch unit 244 may transmit a part of the latched normal data to the data output buffer unit 254 through the rising edge synchronization data output lines RDL_OUT<7:0> in synchronization with the rising edge of the read enable pipe signal RE_PIPE. Furthermore, the data output latch unit 244 may transmit a remaining part of the latched normal data to the data output buffer unit 254 through the falling edge synchronization data output lines FDL_OUT<7:0> in synchronization with the falling edge of the read enable pipe signal RE_PIPE. The rising edge synchronization data output lines RDL_OUT<7:0> and the falling edge synchronization data output lines FDL_OUT<7:0> may be included in the column lines CL of FIG. 2.

Further, the data output latch unit 244 may latch the logic data, received from the logic data control unit 243 through the logic data output lines LOG_OUT<15:0>. Furthermore, the data output latch unit 244 may transmit the latched logic data to the data output buffer unit 254 through the rising edge synchronization data output lines RDL_OUT<7:0> in synchronization with the rising edge of the read enable pipe signal RE_PIPE. Here, the logic data latched in the data output latch unit 244 may be transmitted only through the rising edge synchronization data output lines RDL_OUT<7:0> and may not be transmitted through the falling edge synchronization data output lines FDL_OUT<7:0>.

In synchronization with the rising clock signal RCLK, the data output buffer unit 254 may buffer at least the normal data or logic data, received through the rising edge synchronization data output lines RDL_OUT<7:0>, or may output the normal data or the logic data to the external device through the data input/output lines DQ<7:0>. Furthermore, in synchronization with the falling clock signal FCLK, the data output buffer unit 254 may buffer the normal data, received through the falling edge synchronization data output lines FDL_OUT<7:0>, or may output the normal data to the external device through the data input/output lines DQ<7:0>.

Figure 5:
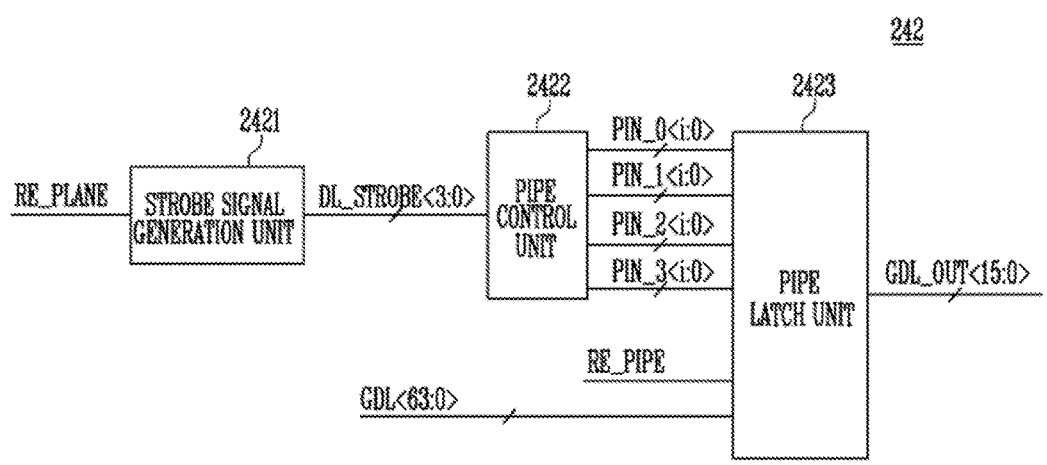
FIG. 5 is a diagram illustrating in detail a pipe latch control unit of FIG. 4.

FIG. 5 is a diagram illustrating the pipe latch control unit 242.

Referring to FIG. 5, the pipe latch control unit 242 may include a strobe signal generation unit 2421, a pipe control unit 2422, and a pipe latch unit 2423.

The strobe signal generation unit 2421 may generate a data line strobe signal DL_STROBE<3:0> in response to the read enable plane signal RE_PLANE.

The pipe control unit 2422 may generate a first pipe input signal PIN_0<i:0>, a second pipe input signal PIN_1<i:0>, a third pipe input signal PIN_2<i:0>, and a fourth pipe input signal PIN_3<i:0> based on the data line strobe signal DL_STROBE<3:0>, where i is a natural number and the value of i may be selected depending on various design methods.

The pipe latch unit 2423 may latch normal data transmitted through global data lines GDL<63:0>. Here, the pipe latch unit 2423 may be operated in response to the first pipe input signal PIN_0<i:0>, the second pipe input signal PIN_1<i:0>, the third pipe input signal PIN_2<i:0>, and the fourth pipe input signal PIN_3<i:0>. The pipe latch unit 2423 may transmit first 2-byte data in advance to global data output lines GDL_OUT<15:0> in response to a read enable pipe signal RE_PIPE, the first pipe input signal PIN_0<i:0>, the second pipe input signal PIN_1<i:0>, the third pipe input signal PIN_2<i:0>, and the fourth pipe input signal PIN_3<i:0> before the read enable signal RE_N becomes activated. While a dummy data enable signal DUMMY_EN is activated, initial 2-byte data, stored in the pipe latch unit 2423, may be outputted through the global data output lines GDL_OUT<15:0> in synchronization with the rising edge of the read enable pipe signal RE_PIPE. This operation will be described below with reference to FIG. 6.

Figure 6:
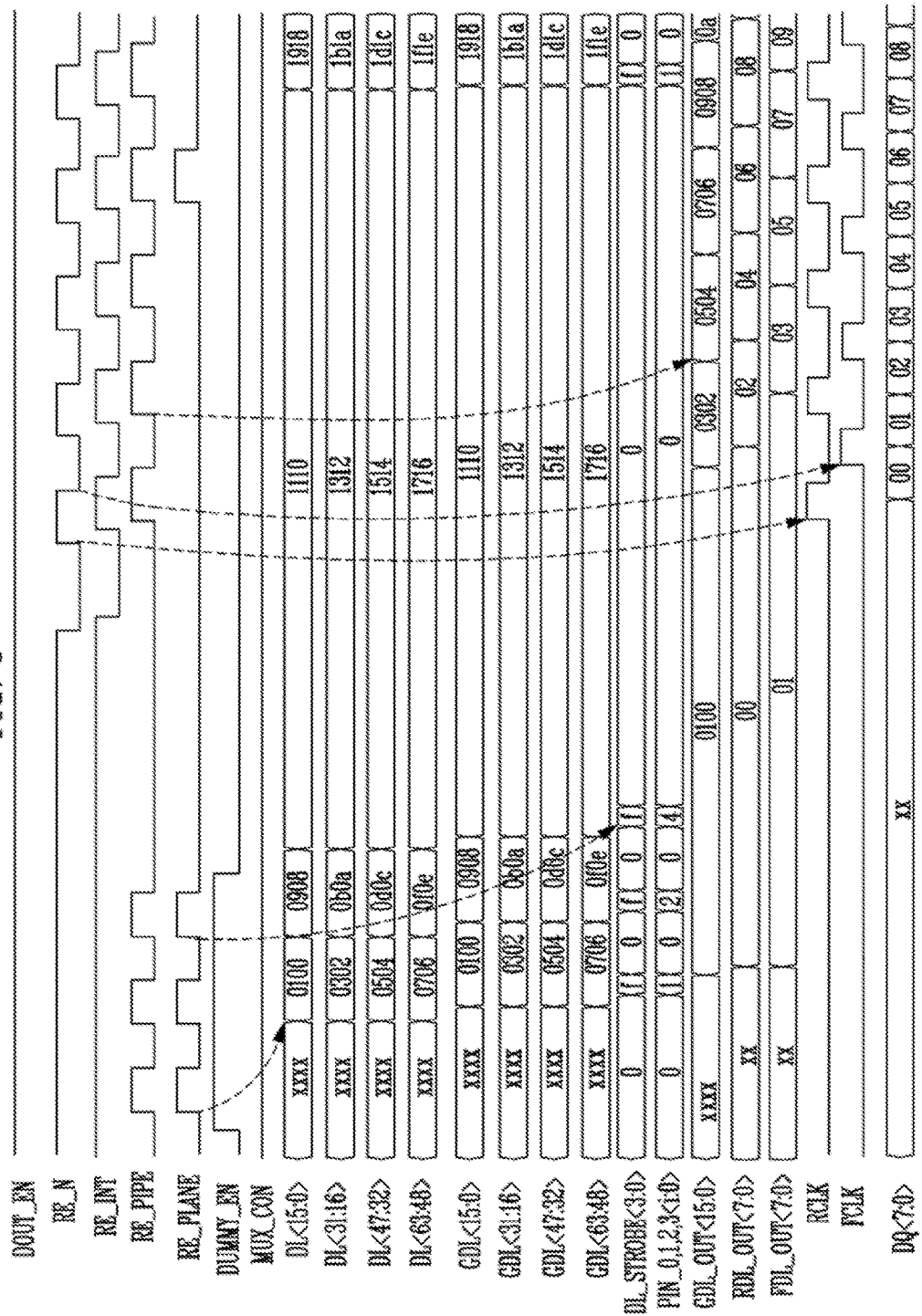
FIG. 6 is a timing diagram describing a normal data output operation depending on the data output path shown in FIG. 4.

FIG. 6 is a timing diagram describing the normal data output operation depending on the data output path of FIG. 4.

Referring to FIG. 6, when a normal data output command and an address for a normal data output operation are inputted from an external device to the memory device 1100, the data output enable signal DOUT_EN is activated, and an internal operation of the memory device 1100 for outputting data may be initiated in response to the activated data output enable signal DOUT_EN.

The memory device 1100 performs an operation of reading part of normal data stored in the memory cell array 100 using the page buffer group 230 and latching the read data in the pipe latch unit 2423 before normal data is outputted to the external device in synchronization with the activation of the read enable signal RE_N. First, the read enable plane signal RE_PLANE and the read enable pipe signal RE_PIPE are generated based on the dummy data enable signal DUMMY_EN generated by the control logic 300. That is, while the dummy data enable signal DUMMY_EN is activated, the read enable plane signal RE_PLANE and the read enable pipe signal RE_PIPE may be generated in the form of continuous pulses or may be activated, as shown in FIG. 6. In response to the read enable plane signal RE_PLANE, the normal data, sensed by the page buffer group 230 from the memory cell array 100, may be outputted to the multiplexer unit 241 of FIG. 4 through the data lines DL<63:0>. Also, in response to the read enable pipe signal RE_PIPE, the normal data, received from the multiplexer unit 241 through the global data lines GDL<63:0>, may be latched in the pipe latch unit 2423 of the pipe latch control unit 242 of FIG. 5. The pipe latch unit 2423 may latch the normal data, received through the global data lines GDL<63:0>, based on the read enable pipe signal RE_PIPE, the first pipe input signal PIN_0<i:0>, the second pipe input signal PIN_1<i:0>, the third pipe input signal PIN_2<i:0>, and the fourth pipe input signal PIN_3<i:0>.

After the initial 2-bytes of data have been latched in the pipe latch unit 2423, the read enable signal RE_N may be activated. The read enable buffer unit 253 may generate an internal read enable signal RE_INT by delaying the read enable signal RE_N, and the read enable control unit 252 may control activation of the read enable pipe signal RE_PIPE in synchronization with the internal read enable signal RE_INT. The normal data, latched in the pipe latch unit 2423 of the pipe latch control unit 242, is outputted to the data output latch unit 244 through the global data output lines GDL_OUT<15:0> in synchronization with the read enable pipe signal RE_PIPE. Further, the normal data, latched in the data output latch unit 244 in synchronization with the read enable pipe signal RE_PIPE, may be transmitted to the data output buffer unit 254 through the rising edge synchronization data output lines RDL_OUT<7:0> and the falling edge synchronization data output lines FDL_OUT<7:0>. A part of the normal data latched in the data output latch unit 244 may be outputted through the rising edge synchronization data output lines RDL_OUT<7:0> in synchronization with the rising edge of the read enable pipe signal RE_PIPE, and the remaining part of the normal data latched in the data output latch unit 244 may be outputted through the falling edge synchronization data output lines FDL_OUT<7:0> in synchronization with the falling edge of the read enable pipe signal RE_PIPE.

The rising clock signal RCLK may toggle in synchronization with the rising edge of the read enable signal RE_N, and the falling clock signal FCLK may toggle in synchronization with the falling edge of the read enable signal RE_N. The normal data, buffered in the data output buffer unit 254, may be outputted to the external device in synchronization with the rising clock signal RCLK and the falling clock signal FCLK. The data, transmitted to the data output buffer unit 254 through the rising edge synchronization data output lines RDL_OUT<7:0>, may be outputted to the data input/output lines DQ<7:0> in synchronization with the rising clock signal RCLK, and the data, transmitted to the data output buffer unit 254 through the falling edge synchronization data output lines FDL_OUT<7:0>, may be outputted to the data input/output lines DQ<7:0> in synchronization with the falling clock signal FCLK. In response to the rising clock signal RCLK and the falling clock signal FCLK, the data may be outputted at dual data rate (DDR).

In FIG. 6, values '0100' and '00' of normal data loaded onto the data lines DL<63:0> and the data input/output lines DQ<7:0> are examples that help understanding a normal data output operation, but, in actual operations, various values of normal data may be outputted without being limited thereto. Also, indication 'xxxx' and 'xx' on the data lines DL<63:0> and the data input/output lines DQ<7:0> represent an unknown value.

Figure 7:
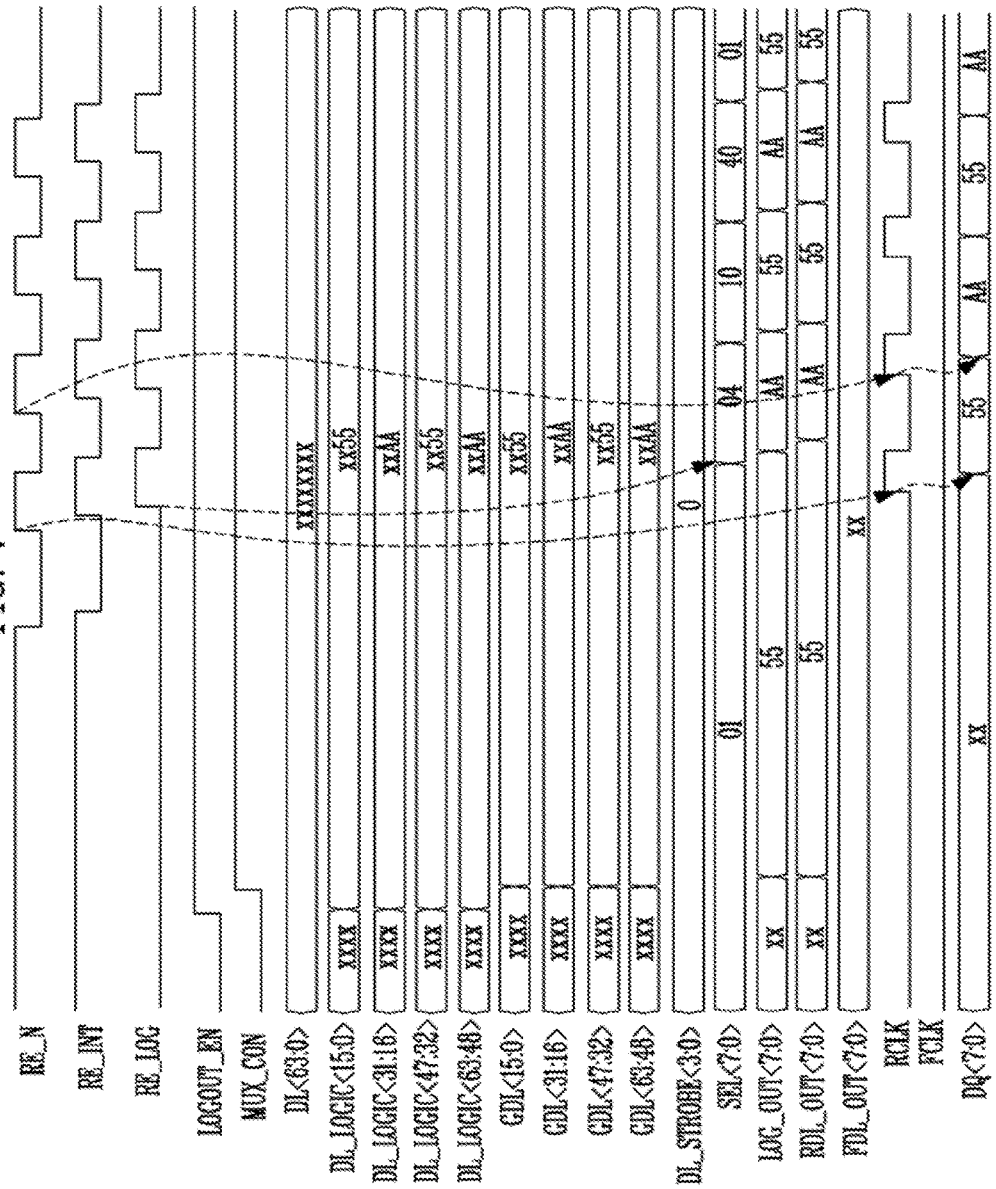
FIG. 7 is a timing diagram describing a logic data output operation depending on the data output path shown in FIG. 4.

FIG. 7 is a timing diagram describing the logic data output operation depending on the data output path of FIG. 4.

Referring to FIG. 7, an operation in which the memory device 1100 outputs 4-byte logic data to an external device is illustrated. When a logic data output command for a logic data output operation is inputted from the external device, the logic data output enable signal LOGOUT_EN is activated, and then the logic data output operation is initiated. The logic data output command for the logic data output operation is also referred to as a "get feature command".

When the logic data output operation is initiated, the logic data output enable signal LOGOUT_EN is activated, the logic data, stored in the registers of the control logic 300, is transmitted to the multiplexer unit 241 through the logic data lines DL_LOGIC<63:0> according to the activation of the logic data output enable signal LOGOUT_EN. Further, the multiplexer unit 241 transmits the logic data, received from the control logic 300, to the logic data control unit 243 through the global data lines GDL<63:0> according to the activation of the MUX signal MUX_CON. The activation of the MUX signal MUX_CON may function as a flag signal indicating that a current data output operation is a logic data output operation.

Then, the read enable signal RE_N may start to toggle and the read enable buffer unit 253 may generate the internal read enable signal RE_INT by delaying the read enable signal RE_N. The read enable control unit 252 may generate the read enable logic signal RE_LOG in response to the internal read enable signal RE_INT. The read enable logic signal RE_LOG may be activated in synchronization with the internal read enable signal RE_INT. The logic data control unit 243 of FIG. 4 may generate a select bus signal SEL<7:0> in response to the read enable logic signal RE_LOG. Also, the logic data control unit 243 may transmit the logic data, received from the multiplexer unit 241, to the data output latch unit 244 through the logic data output lines LOG_OUT<15:0> in response to the select bus signal SEL<7:0>.

While the logic data output operation is performed, the read enable buffer unit 253 may perform control such that only one of the rising clock signal RCLK and the falling clock signal FCLK is activated based on the logic data output enable signal LOGOUT_EN. During the performance of the logic data output operation, the read enable buffer unit 253 may activate the rising clock signal RCLK based on the logic data output enable signal LOGOUT_EN and may maintain the falling clock signal FCLK deactivated. The deactivated state may be a state in which a constant value is maintained.

The data output latch unit 244 may transmit the logic data, received from the logic data control unit 243, to the data output buffer unit 254 through the rising edge synchronization data output lines RDL_OUT<7:0>. The data output buffer unit 254 may output the logic data, received through the rising edge synchronization data output lines RDL_OUT<7:0>, to the external device through the data input/output lines DQ<7:0> in synchronization with the rising clock signal RCLK.

In FIG. 7, values '55' and 'AA' of logic data loaded onto the data lines DL<63:0> and data input/output lines DQ<7:0> are examples that help understanding a logic data output operation, but, in actual operation, various values of logic data may be outputted without being limited thereto. Further, 'xxxx' and 'xx' on the data lines DL<63:0> and the data input/output lines DQ<7:0> represents an unknown value.

An operation frequency of the data output operation of a memory device is continuously increasing. Accordingly, there may be an increasing probability of an error during the data output operation of the memory device, thus deteriorating the reliability of the memory device. As a result, the design of the data output path of the memory device becomes increasingly important. Referring to FIGS. 4 to 6, the normal data output operation and the logic data output operation may be performed using different data paths. The normal data may be outputted through the pipe latch control unit 242 in response to the read enable pipe signal RE_PIPE, and the logic data may be outputted through the logic data control unit 243 in response to the read enable logic signal RE_LOG and the select bus signal SEL<7:0>.

Figure 8:
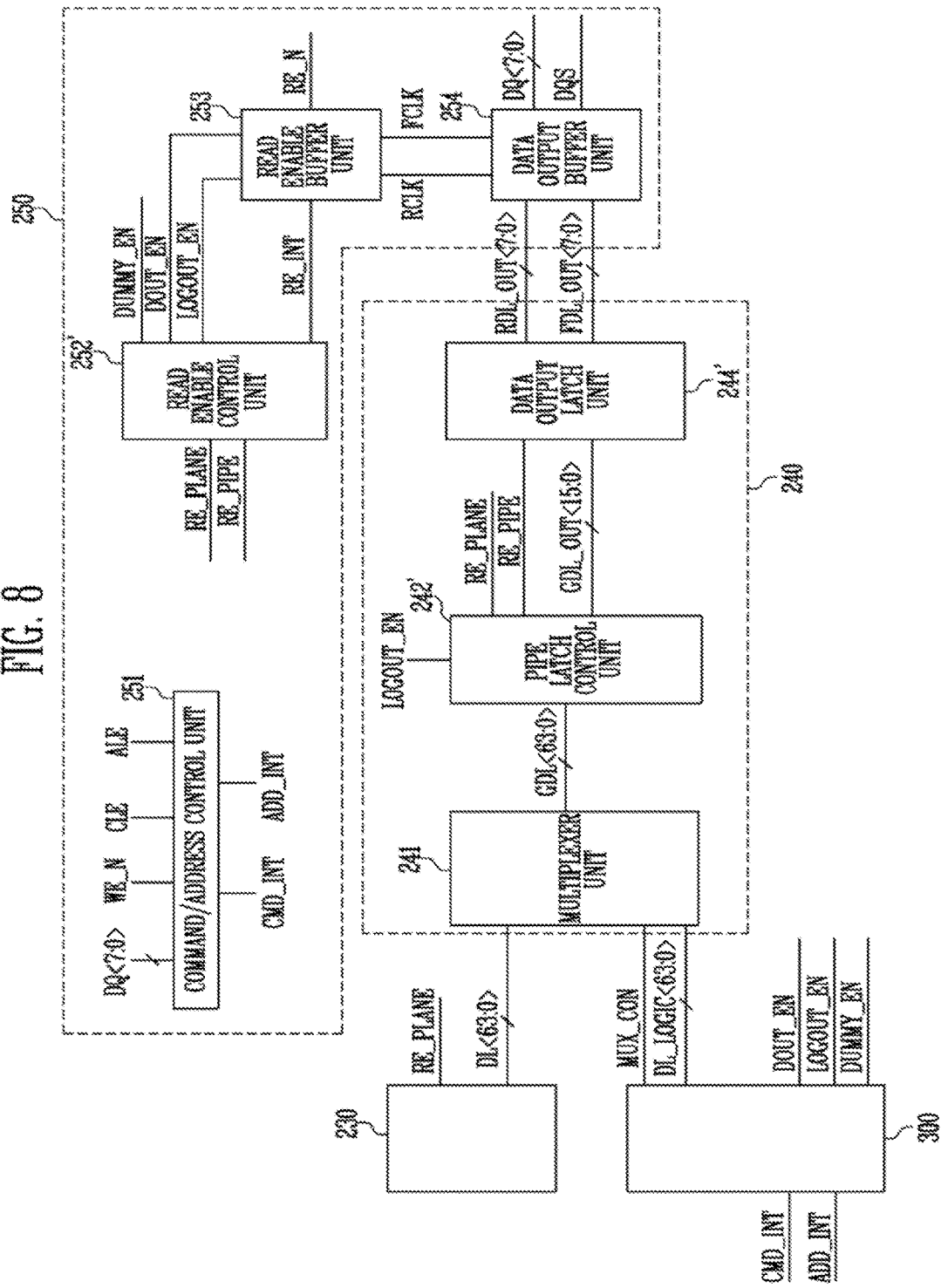
FIG. 8 is a diagram describing a data output path according to an embodiment of the present disclosure.

FIG. 8 is a diagram describing a data output path according to an embodiment of the present disclosure.

Referring to FIG. 8, the normal data output path and the logic data output path may share a pipe latch control unit 242' and global data output lines GDL_OUT<15:0> with each other. Normal data outputted through a page buffer group 230, and logic data outputted from the control logic 300, may share the same data path until the normal data and the logic data are outputted from the multiplexer unit 241 to an external device through data input/output lines DQ<7:0>. Unlike the data output path illustrated in FIG. 4, the output paths do not include the separate logic data control unit 243 and separate logic data output lines LOG_OUT<15:0> for the logic data output operation. Also, the pipe latch control unit 242' and the global data output lines GDL_OUT<15:0> of FIG. 8 may perform a function for a logic data output operation.

A read enable control unit 252' of FIG. 8 may receive a logic data output enable signal LOGOUT_EN as an input, unlike the read enable control unit 252 of FIG. 4. The read enable control unit 252' may generate the read enable pipe signal RE_PIPE in response to at least one of the logic data output enable signal LOGOUT_EN and the data output enable signal DOUT_EN. In the data output path and the timing control method illustrated in FIGS. 4 to 7, the read enable pipe signal RE_PIPE is activated in synchronization with the internal read enable signal RE_INT during the normal data output operation and is deactivated during the logic data output operation. However, the read enable pipe signal RE_PIPE illustrated in FIG. 8 may be activated in synchronization with the internal read enable signal RE_INT even during the logic data output period, as well as the normal data output period, in response to the logic data output enable signal LOGOUT_EN. The read enable pipe signal RE_PIPE of FIG. 8 may perform a function of the read enable logic signal RE_LOG of FIGS. 4 to 7 during the logic data output operation. A read enable control unit 252' of FIG. 8 may not generate the separate read enable logic signal RF_LOG, unlike the read enable control unit 252 of FIG. 4.

The pipe latch control unit 242' of FIG. 8 is used as the normal data output path, which is similar to the pipe latch control unit 242 of FIG. 4. Further, the pipe latch control unit 242' may latch logic data, transmitted through the global data lines GDL<63:0> in response to the logic data output enable signal LOGOUT_EN. That is, the pipe latch control unit 242' may latch the logic data, transmitted through the global data lines GDL<63:0>, when the logic data output enable signal LOGOUT_EN is activated, and may latch the normal data, transmitted through the global data lines GDL<63:0>, when the read enable plane signal RE_PLANE is activated.

A data output latch unit 244' may transmit the normal data to the data output buffer unit 254 through rising edge synchronization data output lines RDL_OUT<7:0> and falling edge synchronization data output lines FDL_OUT<7:0> in response to the read enable pipe signal RE_PIPE. Further, the data output buffer unit 254 may output the normal data to the external device through the data input/output lines DQ<7:0> in synchronization with the rising clock signal RCLK and the falling clock signal FCLK. In an embodiment, the data output latch unit 244' may transmit a part of the normal data through the rising edge synchronization data output lines RDL_OUT<7:0> in synchronization with the rising edge of the read enable pipe signal RE_PIPE, and may transmit a remaining part of the normal data to the data output buffer unit 254 through the falling edge synchronization data output lines FDL_OUT<7:0> in synchronization with the falling edge of the read enable pipe signal RE_PIPE. Furthermore, the data output buffer unit 254 may output the normal data to the external device through the data input/output lines DQ<7:0> in synchronization with the rising clock signal RCLK and the falling clock signal FCLK. The rising edge synchronization data output lines RDL_OUT<7:0> and the falling edge synchronization data output lines FDL_OUT<7:0> may be included in the column lines CL of FIG. 2.

The data output latch unit 244' may transmit the logic data to the data output buffer unit 254 through the rising edge synchronization data output lines RDL_OUT<7:0> in synchronization with the read enable pipe signal RE_PIPE. The data output latch unit 244' may transmit the logic data to the data output buffer unit 254 through the rising edge synchronization data output lines RDL_OUT<7:0> in synchronization with the rising edge of the read enable pipe signal RE_PIPE. Further, the data output buffer unit 254 may output the logic data, received through the rising edge synchronization data output lines RDL_OUT<7:0>, to the external device through the data input/output lines DQ<7:0> in synchronization with the rising clock signal RCLK. The logic data may not pass through the falling edge synchronization data output lines FDL_OUT<7:0>, and the falling clock signal FCLK may be maintained in a deactivated state.

The normal data may be outputted at a double data rate (DDR), and the logic data may be outputted at a single data rate (SDR). Therefore, the logic data may have a greater timing margin in the data output operation, compared to the normal data.

Since the configurations and operations of the command/address control unit 251, the read enable buffer unit 253, and the data output buffer unit 254 have been described in detail with reference to FIG. 4, a detailed description thereof will be omitted.

Figure 9:
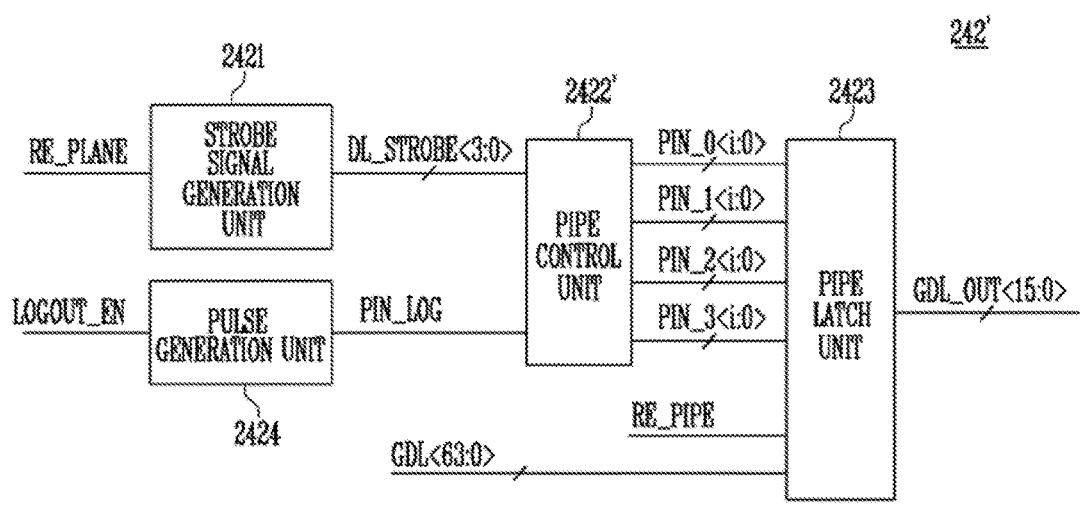
FIG. 9 is a diagram illustrating a pipe latch control unit of FIG. 8 according to an embodiment of the present disclosure.

FIG. 9 is a diagram illustrating the pipe latch control unit 242'.

Referring to FIG. 9, the pipe latch control unit 242' may include the strobe signal generation unit 2421, a pipe control unit 2422', the pipe latch unit 2423, and a pulse generation unit 2424. The pipe latch control unit 242' of FIG. 9 may additionally include the pulse generation unit 2424, unlike the pipe latch control unit 242 of FIG. 4. The pulse generation unit 2424 is configured to perform the logic data output operation and may generate a logic data pipe input signal PIN_LOG in response to the logic data output enable signal LOGOUT_EN. The logic data pipe input signal PIN_LOG may be a signal for generating a pulse according to the activation of the logic data output enable signal LOGOUT_EN.

The pipe control unit 2422' of FIG. 9 may generate a first pipe input signal PIN_0<i:0>, a second pipe input signal PIN_1<i:0>, a third pipe input signal PIN_2<i:0>, and a fourth pipe input signal PIN_3<i:0> based on the data line strobe signal DL_STROBE<3:0> that is generated by the strobe signal generation unit 2421 during the normal data output operation. During the normal data output operation, the logic data pipe input signal PIN_LOG may be deactivated.

The pipe control unit 2422' may change the values of the first pipe input signal PIN_0<i:0>, the second pipe input signal PIN_1<i:0>, the third pipe input signal PIN_2<i:0>, and the fourth pipe input signal PIN_3<i:0> in response to the logic data pipe input signal PIN_LOG during the logic data output operation. For example, the value of a lower 1 bit of each of the first pipe input signal PIN_0<i:0>, the second pipe input signal PIN_1<i:0>, the third pipe input signal PIN_2<i:0>, and the fourth pipe input signal PIN_3<i:0> may be changed in response to the pulse of the logic data pipe input signal PIN_LOG. During the logic data output operation, the data line strobe signal DL_STROBE<3:0> may be deactivated.

The pipe latch unit 2423 may output the normal data and/or the logic data, transmitted through the global data lines GDL<63:0>, through the global data output lines GDL_OUT<15:0> in response to the read enable pipe signal RE_PIPE. As described above, the read enable pipe signal RE_PIPE of FIGS. 8 and 9 may be activated during the normal data output operation and the logic data output operation, unlike FIGS. 4 to 7.

The normal data output path and the signal control method in the data output path, described above with reference to FIGS. 8 and 9, are substantially identical to the normal data output path and the signal control method, described above with reference to FIGS. 4 to 7. Therefore, a detailed description thereof will be omitted.

Figure 10:
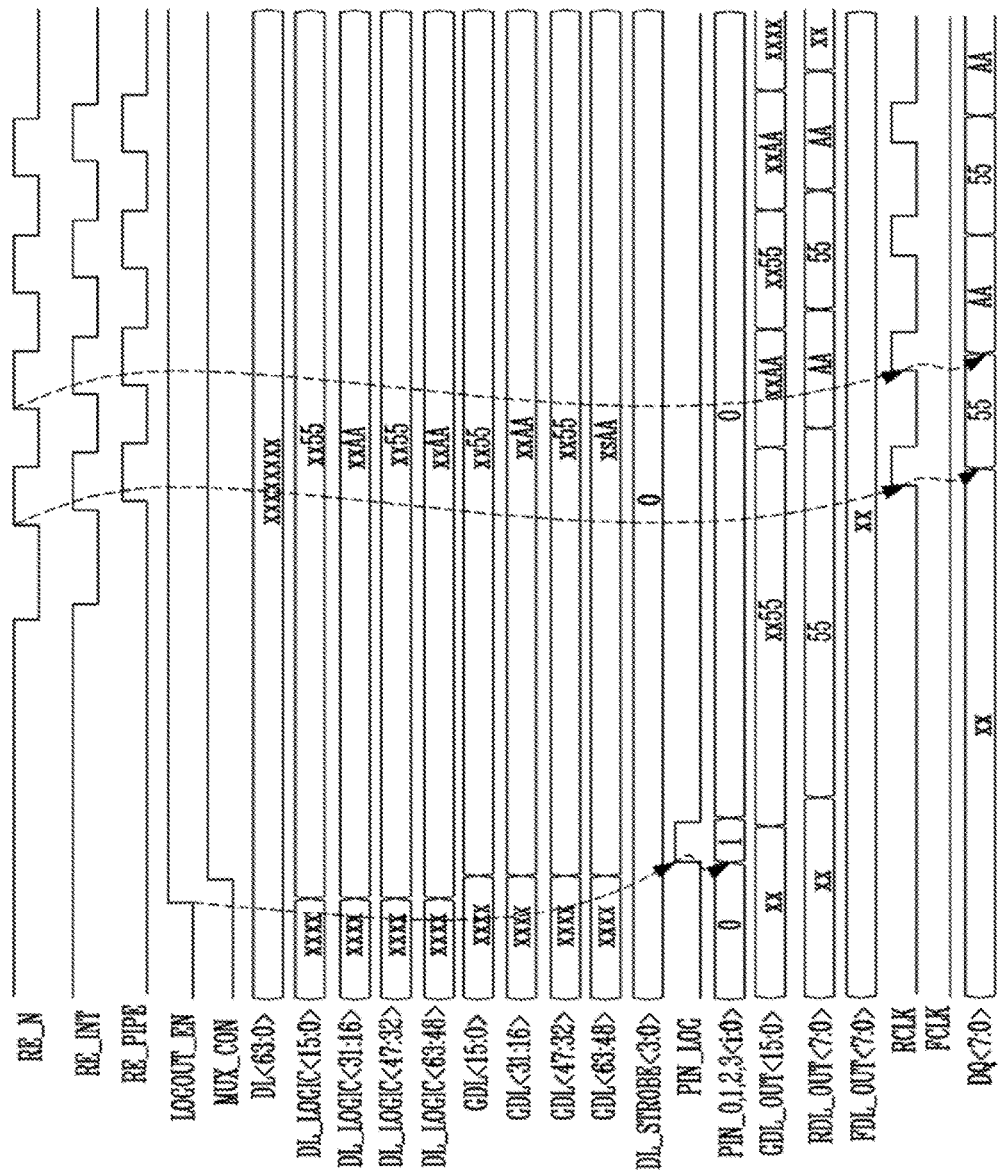
FIG. 10 is a timing diagram describing a logic data output operation depending on the data output path shown in FIGS. 8 and 9.

FIG. 10 is a timing diagram describing the logic data output operation depending on the data output path of FIGS. 8 and 9.

Referring to FIG. 10, an operation of outputting 4-byte logic data to an external device is illustrated. When a logic data output command for a logic data output operation is inputted from the external device, the logic data output enable signal LOGOUT_EN is activated, and the logic data output operation is initiated. According to the activation of the logic data output enable signal LOGOUT_EN, logic data stored in the registers of the control logic 300 is transmitted to the multiplexer unit 241 through the logic data lines DL_LOGIC<63:0>. Further, the multiplexer unit 241 transmits the logic data, received from the control logic 300, to the pipe latch control unit 242' through the global data lines GDL<63:0> according to the activation of a MUX signal MUX_CON.

As described above with reference to FIG. 9, the logic data pipe input signal PIN_LOG is generated according to the activation of the logic data output enable signal LOGOUT_EN. The logic data pipe input signal PIN_LOG may be a pulse signal that is generated according to the activation of the logic data output enable signal LOGOUT_EN.

According to the activation of the logic data pipe input signal PIN_LOG, the values of the first pipe input signal PIN_0<i:0>, the second pipe input signal PIN_1<i:0>, the third pipe input signal PIN_2<i:0>, and the fourth pipe input signal PIN_3<i:0> may be changed. The logic data inputted through the global data lines GDL<63:0> may be transmitted to the global data output lines GDL_OUT<15:0>, based on the first pipe input signal PIN_0<i:0>, the second pipe input signal PIN_1<i:0>, the third pipe input signal PIN_2<i:0>, and the fourth pipe input signal PIN_3<i:0>. The activation of the logic data pipe input signal PIN_LOG enables part of the logic data stored in the control logic 300 to be transmitted to the global data output lines GDL_OUT<15:0> in advance before the read enable signal RE_N is activated.

During the logic data output operation, logic data transmitted through an 8-bit transfer bus among the global data output lines GDL_OUT<15:0> is ignored, that is, a "don't care" state, and the logic data may be transmitted using only the remaining 8-bit transfer bus. For example, the logic data may be transmitted through a lower 8-bit transfer bus, among the global data output lines GDL_OUT<15:0>, and may not be transmitted through an upper 8-bit transfer bus, among the global data output lines GDL_OUT<15:0>.

When the read enable signal RE_N becomes activated, the logic data, transmitted through the global data output lines GDL_OUT<15:0>, may be transferred to the data output buffer unit 254 in synchronization with the read enable pipe signal RE_PIPE. Logic data, latched in the data output latch unit 244', may be transmitted through either of the rising edge synchronization data output lines RDL_OUT<7:0> and the falling edge synchronization data output lines FDL_OUT<7:0>. For example, the logic data that is transmitted through the lower 8-bit transfer bus, among the global data output lines GDL_OUT<15:0>, may be transferred to the data output buffer unit 254 through the rising edge synchronization data output lines RDL_OUT<7:0> in synchronization with the rising edge of the read enable pipe signal RE_PIPE. The logic data may not be transmitted through the falling edge synchronization data output lines FDL_OUT<7:0>.

The logic data that is transmitted to the data output buffer unit 254 through the rising edge synchronization data output lines RDL_OUT<7:0> may be outputted to the external device through the data input/output lines DQ<7:0> in synchronization with the rising clock signal RCLK. Furthermore, the falling clock signal FCLK may be maintained in a deactivated state.

In an embodiment, logic data may be transmitted to the data output latch unit 244' through the upper 8-bit transfer bus, among the global data output lines GDL_OUT<15:0>. The logic data that is transmitted to the data output latch unit 244' through the upper 8-bit bus, among the global data output lines GDL_OUT<15:0>, may be transferred to the data output buffer unit 254 through the falling edge synchronization data output lines FDL_OUT<7:0> in synchronization with the falling edge of the read enable pipe signal RE_PIPE. Further, the logic data that is transferred to the data output buffer unit 254 through the falling edge synchronization data output lines FDL_OUT<7:0> may be outputted to the external device through the data input/output lines DQ<7:0> in synchronization with the falling clock signal FCLK. The rising clock signal RCLK may be maintained in a deactivated state.

In FIG. 10, values '55' and 'AA' of logic data loaded onto the data lines DL<63:0> and the data input/output lines DQ<7:0> are examples that help understanding a logic data output operation, but, in actual operation, various values of logic data may be outputted without being limited thereto. Further, 'xxxx' and 'xx' on the data lines DL<63:0> and the data input/output lines DQ<7:0> represents an unknown value.

As described above with reference to FIGS. 8 to 10, when a normal data output path and a logic data output path are shared, higher reliability may be obtained in a high-speed data output operation. The logic data output path may not be configured separately from the normal data output path, and the logic data may be outputted using the normal data output path, so that a data output path may be simplified, and, as a result, more reliable timing control may be possible.

Figure 11:
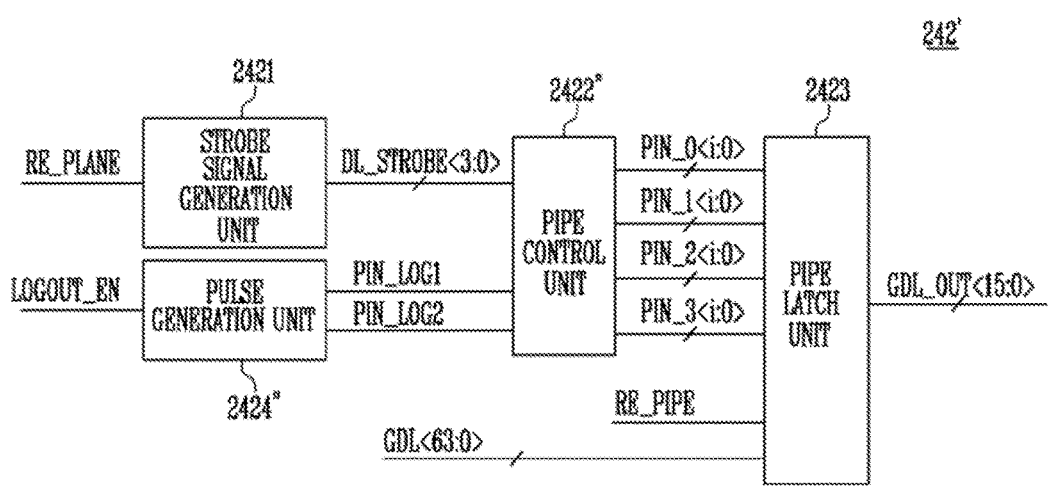
FIG. 11 is a diagram illustrating the pipe latch control unit of FIG. 8 according to an embodiment of the present disclosure.

FIG. 11 is a diagram illustrating the pipe latch control unit 242'.

Referring to FIG. 11, a pulse generation unit 2424" of the pipe latch control unit 242' may generate a first logic data pipe input signal PIN_LOG1 and a second logic data pipe input signal PIN_LOG2 in response to the logic data output enable signal LOGOUT_EN. The first logic data pipe input signal PIN_LOG1 may be generated using the same method as the logic data pipe input signal PIN_LOG of FIGS. 9 and 10. Further, the second logic data pipe input signal PIN_LOG2 may be generated by time-delaying the first logic data pipe input signal PIN_LOG1. The memory device 1100 may output 8-byte logic data using the first logic data pipe input signal PIN_LOG1 and the second logic data pipe input signal PIN_LOG2. That is, 4-byte logic data may be outputted in response to the first logic data pipe input signal PIN_LOG1, and the remaining 4-byte logic data may be outputted in response to the second logic data pipe input signal PIN_LOG2.

During the logic data output operation, a pipe control unit 2422" of the pipe latch control unit 242' may control the value of any one bit of each of the first pipe input signal PIN_0<i:0>, the second pipe input signal PIN_1<i:0>, the third pipe input signal PIN_2<i:0>, and the fourth pipe input signal PIN_3<i:0> based on the first logic data pipe input signal PIN_LOG1, and may control the value of an additional bit of each of the first pipe input signal PIN_0<i:0>, the second pipe input signal PIN_1<i:0>, the third pipe input signal PIN_2<i:0>, and the fourth pipe input signal PIN_3<i:0> based on the second logic data pipe input signal PIN_LOG2. For example, when i is 1, the pipe control unit 2422" may control the value of a lower bit of each of the first pipe input signal PIN_0<i:0>, the second pipe input signal PIN_1<i:0>, the third pipe input signal PIN_2<i:0>, and the fourth pipe input signal PIN_3<i:0>, based on the first logic data pipe input signal PIN_LOG1 and may control the value of an upper bit of each of the first pipe input signal PIN_0<i:0>, the second pipe input signal PIN_1<i:0>, the third pipe input signal PIN_2<i:0>, and the fourth pipe input signal PIN_3<i:0>, based on the second logic data pipe input signal PIN_LOG2 during the logic data output operation.

A pipe latch unit 2423 may latch logic data transmitted through global data lines GDL<63:0> in response to the first pipe input signal PIN_0<i:0>, the second pipe input signal PIN_1<i:0>, the third pipe input signal PIN_2<i:0>, and the fourth pipe input signal PIN_3<i:0>. Further, the pipe latch unit 2423 may output the latched logic data through global data output lines GDL_OUT<15:0> in synchronization with the read enable pipe signal RE_PIPE.

Figure 12:
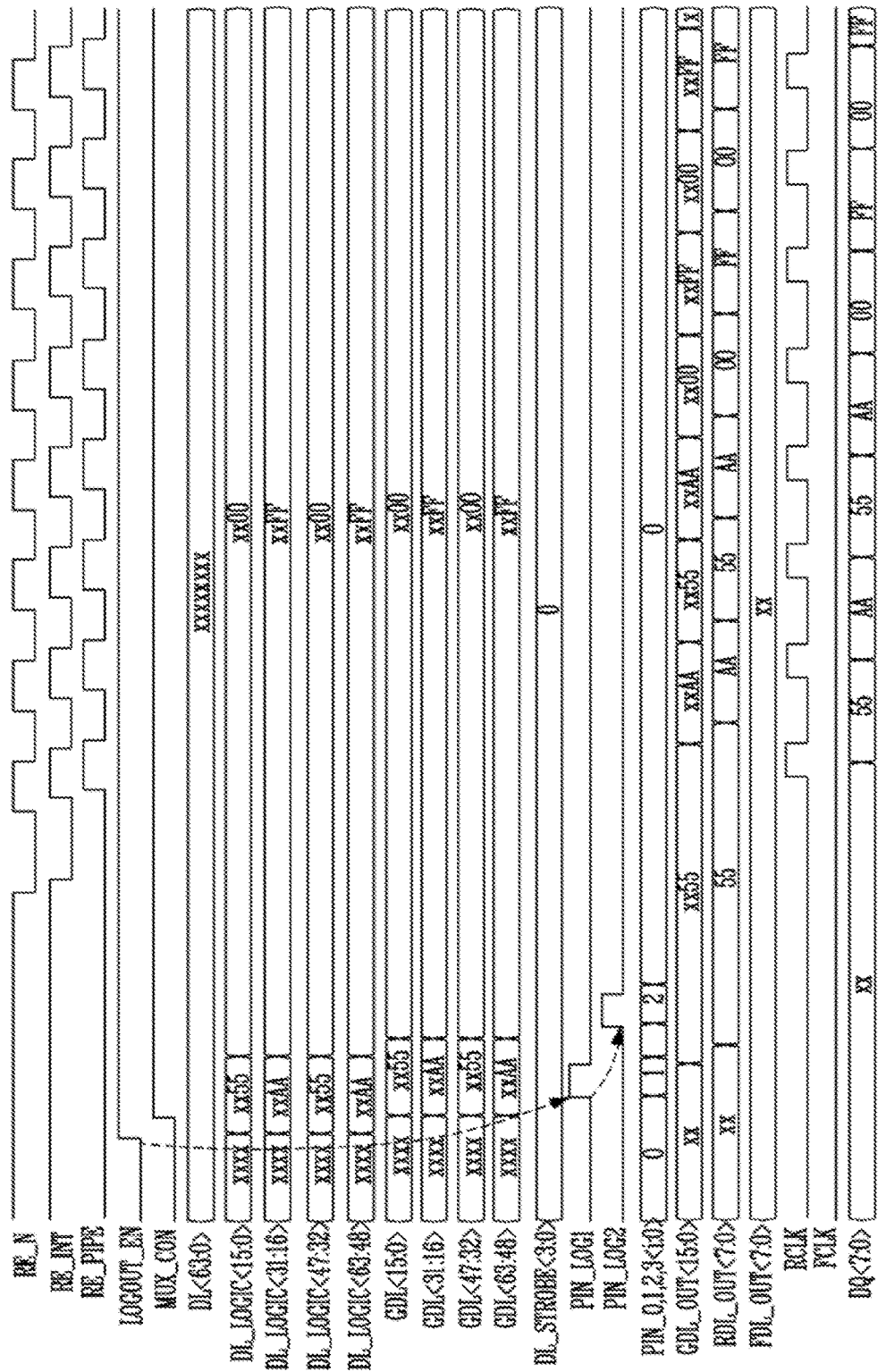
FIG. 12 is a timing diagram describing a logic data output operation depending on the data output path shown in FIGS. 8 and 11.

FIG. 12 is a timing diagram describing the logic data output operation depending on the data output path of FIGS. 8 and 11.

Referring to FIG. 12, an operation for outputting 8-byte logic data to an external device is illustrated. When a logic data output command for a logic data output operation is inputted from the external device, the logic data output enable signal LOGOUT_EN is activated, and the logic data output operation is initiated. According to the activation of the logic data output enable signal LOGOUT_EN, the logic data stored in the registers of the control logic 300 is transmitted to the multiplexer unit 241 through the logic data lines DL_LOGIC<63:0>. Also, the multiplexer unit 241 transmits the logic data, received from the control logic 300, to the pipe latch control unit 242' through the global data lines GDL<63:0> according to the activation of the MUX signal MUX_CON.

As described above with reference to FIG. 11, the first logic data pipe input signal PIN_LOG1 may be generated according to the activation of the logic data output enable signal LOGOUT_EN and the second logic data pipe input signal PIN_LOG2 may be generated by time-delaying the first logic data pipe input signal PIN_LOG1. As described above, 8-byte logic data may be outputted by generating the first logic data pipe input signal PIN_LOG1 and the second logic data pipe input signal PIN_LOG2. That is, 4-byte logic data may be outputted in response to the first logic data pipe input signal PIN_LOG1, and the remaining 4-byte logic data may be outputted in response to the second logic data pipe input signal PIN_LOG2. The first logic data pipe input signal PIN_LOG1 may be a pulse signal that is generated according to the activation of the logic data output enable signal LOGOUT_EN.

By the activation of the first logic data pipe input signal PIN_LOG1, the pipe control unit 2422" may change the value of a lower bit of each of the first pipe input signal PIN_0<i:0>, the second pipe input signal PIN_1<i:0>, the third pipe input signal PIN_2<i:0>, and the fourth pipe input signal PIN_3<i:0>. By the activation of the second logic data pipe input signal PIN_LOG2, the pipe control unit 2422" may change the value of an additional bit of each of the first pipe input signal PIN_0<i:0>, the second pipe input signal PIN_1<i:0>, the third pipe input signal PIN_2<i:0>, and the fourth pipe input signal PIN_3<i:0> based on the data line strobe signal DL_STROBE<3:0>. Further, the pipe latch unit 2423 may latch the logic data inputted through the global data lines GDL<63:0> based on the first pipe input signal PIN_0<i:0>, the second pipe input signal PIN_1<i:0>, the third pipe input signal PIN_2<i:0>, and the fourth pipe input signal PIN_3<i:0>.

The logic data, latched in the pipe latch unit 2423, may be loaded onto the global data output lines GDL_OUT<15:0> in synchronization with the read enable pipe signal RE_PIPE. The data transmitted through an upper 8-bit transfer bus, among the global data output lines GDL_OUT<15:0>, may be ignored, that is, a "don't care" state. The logic data may be transmitted using only a lower 8-bit transfer bus, among the global data output lines GDL_OUT<15:0>.

When the read enable signal RE_N becomes activated, the data output latch unit 244' may transmit the logic data to the data output buffer unit 254 through either of the rising edge synchronization data output lines RDL_OUT<7:0> and the falling edge synchronization data output lines FDL_OUT<7:0> in synchronization with the read enable pipe signal RE_PIPE. For example, the logic data that is transmitted through the lower 8-bit transfer bus, among the global data output lines GDL_OUT<15:0>, may be transferred to the data output buffer unit 254 through the rising edge synchronization data output lines RDL_OUT<7:0> in synchronization with the rising edge of the read enable pipe signal RE_PIPE.

The logic data that is transferred to the data output buffer unit 254 through the rising edge synchronization data output lines RDL_OUT<7:0> may be outputted to the external device through the data input/output lines DQ<7:0> in synchronization with the rising clock signal RCLK. The falling clock signal FCLK may be maintained in a deactivated state. The logic data may be outputted at single data rate (SDR) with respect to the read enable signal RE_N.

In an embodiment, the logic data may be transmitted to the data output latch unit 244' through the upper 8-bit transfer bus, among the global data output lines GDL_OUT<15:0>. The logic data that is transmitted to the data output latch unit 244' through the upper 8-bit transfer bus, among the global data output lines GDL_OUT<15:0>, may be transferred to the data output buffer unit 254 through the falling edge synchronization data output lines FDL_OUT<7:0> in synchronization with the falling edge of the read enable pipe signal RE_PIPE. Further, the logic data that is transferred to the data output buffer unit 254 through the falling edge synchronization data output lines FDL_OUT<7:0> may be outputted to the external device through the data input/output lines DQ<7:0> in synchronization with the falling clock signal FCLK. The rising clock signal RCLK may be maintained in a deactivated state.

In FIG. 12, values '55' and 'AA' of logic data loaded onto the data lines DL<63:0> and the data input/output lines DQ<7:0> are examples that help understanding a logic data output operation, but, in actual operation, various values of logic data may be outputted without being limited thereto. Further, 'xxxx' and 'xx' on the data lines DL<63:0> and the data input/output lines DQ<7:0> represents an unknown value.

Figure 13:
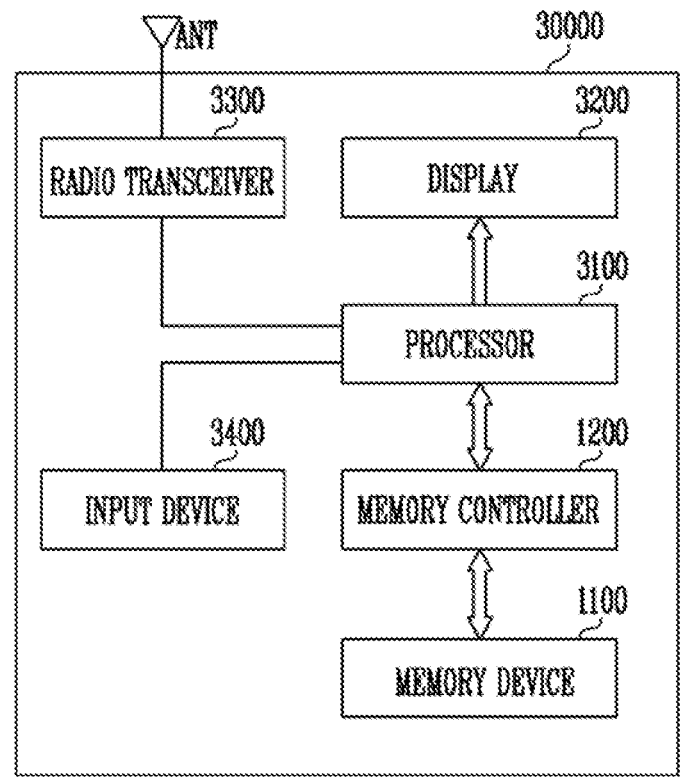
FIG. 13 is a diagram illustrating an embodiment of a memory system including the memory device illustrated in FIG. 2.

FIG. 13 is a diagram illustrating an embodiment of a memory system including the memory device illustrated in FIG. 2.

Referring to FIG. 13, a memory system 30000 may be embodied in a cellular phone, a smartphone, a tablet PC, a personal digital assistant (PDA) or a wireless communication device. The memory system 30000 may include the memory device 1100 and a memory controller 1200 capable of controlling the operation of the memory device 1100. The memory controller 1200 may control a data access operation, for example, a program, erase, or read operation, of the memory device 1100 under the control of a processor 3100.

Data programmed in the memory device 1100 may be outputted through a display 3200 under the control of the memory controller 1200.

A radio transceiver 3300 may send and receive radio signals through an antenna ANT. For example, the radio transceiver 3300 may change a radio signal received through the antenna ANT into a signal which may be processed in the processor 3100. Therefore, the processor 3100 may process a signal outputted from the radio transceiver 3300 and transmit the processed signal to the memory controller 1200 or the display 3200. The memory controller 1200 may program a signal processed by the processor 3100 to the memory device 1100. Furthermore, the radio transceiver 3300 may change a signal outputted from the processor 3100 into a radio signal, and output the changed radio signal to the external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad or a keyboard. The processor 3100 may control the operation of the display 3200 such that data outputted from the memory controller 1200, data outputted from the radio transceiver 3300, or data outputted from the input device 3400 is outputted through the display 3200.

In an embodiment, the memory controller 1200 capable of controlling the operation of the memory device 1100 may be implemented as a part of the processor 3100 or as a chip provided separately from the processor 3100.

Figure 14:
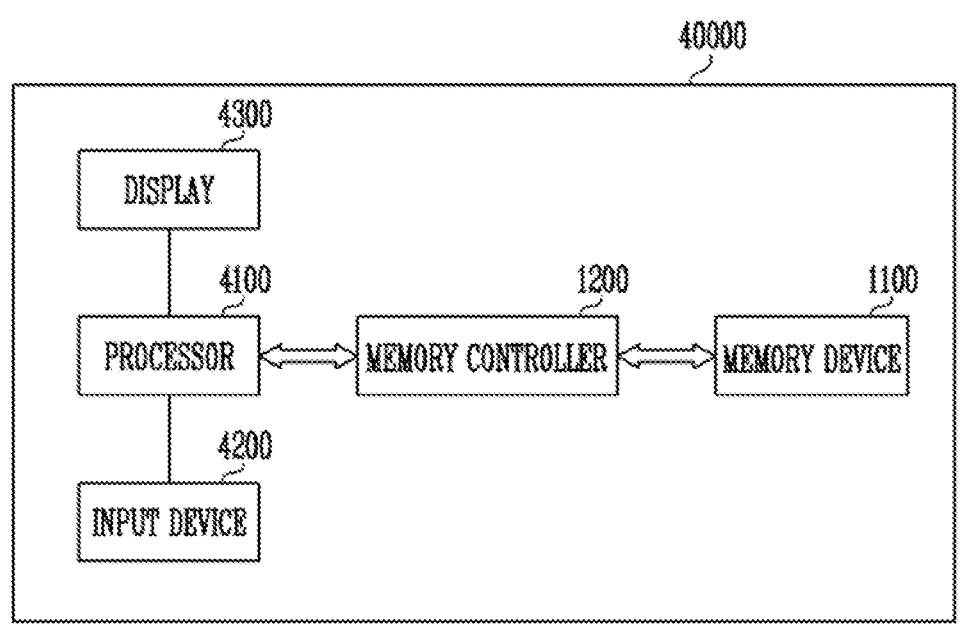
FIG. 14 is a diagram illustrating an embodiment of a memory system including the memory device illustrated in FIG. 2.

FIG. 14 is a diagram illustrating an embodiment of a memory system including the memory device illustrated in FIG. 2.

Referring to FIG. 14, a memory system 40000 may be embodied in a personal computer, a tablet PC, a net-book, an e-reader, a personal digital assistant (PDA), a portable multimedia player (PMP), an MP3 player, or an MP4 player.

The memory system 40000 may include the memory device 1100 and a memory controller 1200 capable of controlling the data processing operation of the memory device 1100.

A processor 4100 may output data stored in the memory device 1100 through a display 4300, according to data inputted from an input device 4200. For example, the input device 4200 may be implemented as a point device such as a touch pad or a computer mouse, a keypad or a keyboard.

The processor 4100 may control the overall operation of the memory system 40000 and control the operation of the memory controller 1200. In an embodiment, the memory controller 1200 capable of controlling the operation of the memory device 1100 may be implemented as a part of the processor 4100 or a chip provided separately from the processor 4100.

Figure 15:
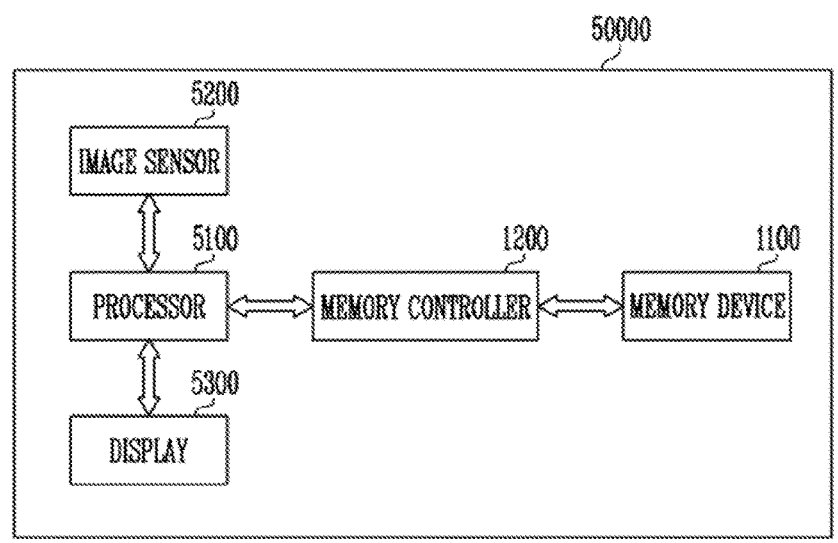
FIG. 15 is a diagram illustrating an embodiment of a memory system including the memory device illustrated in FIG. 2.

FIG. 15 is a diagram illustrating an embodiment of a memory system including the memory device illustrated in FIG. 2.

Referring to FIG. 15, a memory system 50000 may be embodied in an image processing device, for example, a digital camera, a portable phone provided with a digital camera, a smartphone provided with a digital camera, or a tablet PC provided with a digital camera.

The memory system 50000 may include the memory device 1100 and a memory controller 1200 capable of controlling a data processing operation, for example, a program, erase, or read operation, of the memory device 1100.

An image sensor 5200 of the memory system 50000 may convert an optical image into digital signals. The converted digital signals may be transmitted to a processor 5100 or the memory controller 1200. Under the control of the processor 5100, the converted digital signals may be outputted through a display 5300 or stored in the memory device 1100 through the memory controller 1200. Data stored in the memory device 1100 may be outputted through the display 5300 under the control of the processor 5100 or the memory controller 1200.

In an embodiment, the memory controller 1200 capable of controlling the operation of the memory device 1100 may be implemented as a part of the processor 5100, or as a chip provided separately from the processor 5100.

Figure 16:
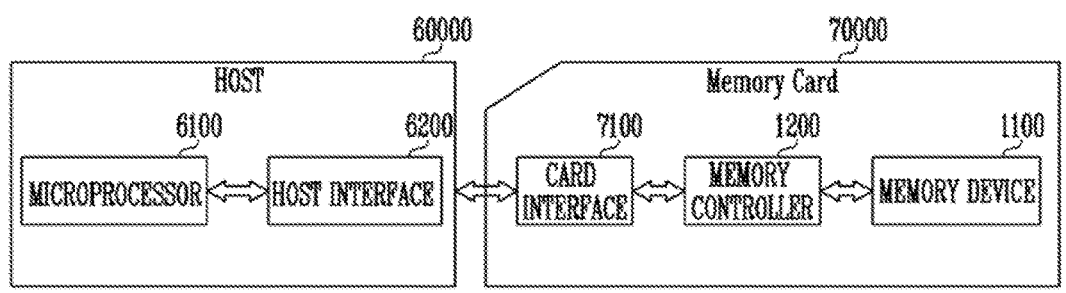
FIG. 16 is a diagram illustrating an embodiment of a memory system including the memory device illustrated in FIG. 2.

FIG. 16 is a diagram illustrating an embodiment of a memory system including the memory device illustrated in FIG. 2.

Referring to FIG. 16, a memory system 70000 may be embodied in a memory card or a smart card. The memory system 70000 may include the memory device 1100, a memory controller 1200 and a card interface 7100.

The memory controller 1200 may control data exchange between the memory device 1100 and the card interface 7100. In an embodiment, the card interface 7100 may be a secure digital (SD) card interface or a multi-media card (MMC) interface, but it is not limited thereto.

The card interface 7100 may interface data exchange between a host 60000 and the memory controller 1200 according to a protocol of the host 60000. In an embodiment, the card interface 7100 may support a universal serial bus (USB) protocol, and an inter-chip (IC)-USB protocol. The card interface may refer to hardware capable of supporting a protocol which is used by the host 60000, software installed in the hardware, or a signal transmission method.

When the memory system 70000 is connected to a host interface 6200 of the host 60000 such as a PC, a tablet PC, a digital camera, a digital audio player, a cellular phone, console video game hardware or a digital set-top box, the host interface 6200 may perform data communication with the memory device 1100 through the card interface 7100 and the memory controller 1200 under the control of a microprocessor 6100.

The present disclosure may improve the reliability of a data output operation of a memory device by optimizing normal data and logic data output paths and control signals related thereto in the data output circuit of the memory device and the method for operating the memory device.

Examples of embodiments have been disclosed herein, and although specific terms are employed, the terms are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory device, comprising:
   a page buffer group configured to read normal data stored in a memory cell array;
   a control logic configured to store logic data; and
   a pipe latch control unit configured to latch the normal data outputted from the page buffer group in synchronization with a read enable pipe signal in response to a normal data output command, and configured to latch the logic data outputted from the control logic in synchronization with the read enable pipe signal in response to a logic data output command,
   wherein the logic data comprises operating condition information of the memory device.

2. The memory device according to claim 1,
   further comprising a data output latch unit configured to receive the normal data and the logic data from the pipe latch control unit and latch the normal data and the logic data,
   wherein the normal data and the logic data that are latched in the pipe latch control unit are sequentially transmitted to the data output latch unit in synchronization with the read enable pipe signal.

3. The memory device according to claim 2,
   wherein the control logic is configured to activate a dummy data enable signal in response to the normal data output command,
   further comprising an input/output circuit configured to activate the read enable pipe signal while the dummy data enable signal is activated,
   wherein the pipe latch control unit is configured to latch a part of the normal data in synchronization with the read enable pipe signal while the dummy data enable signal is activated.

4. The memory device according to claim 3, wherein:
   the control logic further activates a logic data output enable signal in response to the logic data output command, and
   the pipe latch control unit further generates, when the logic data output enable signal is activated, a logic data pipe input signal, and latch a part of the logic data in response to the logic data pipe input signal.

5. The memory device according to claim 4, wherein the input/output circuit further generates a rising clock signal in synchronization with a rising edge of a read enable signal inputted from an external device, generates a falling clock signal in synchronization with a falling edge of the read enable signal, and outputs the normal data to the external device in synchronization with the rising clock signal and the falling clock signal.

6. The memory device according to claim 5, wherein the falling clock signal is maintained at a constant value regardless of the read enable signal while the logic data output enable signal is activated.

7. The memory device according to claim 4, wherein the pipe latch control unit further generates a second logic data pipe input signal by time-delaying the logic data pipe input signal, and latches a remaining part of the logic data in response to the second logic data pipe input signal.

8. The memory device according to claim 4, wherein the input/output circuit activates the read enable pipe signal in synchronization with a read enable signal, which is activated after the pipe latch control unit latches the part of the logic data.

9. The memory device according to claim 8, wherein the control logic further deactivates the dummy data enable signal before the read enable signal is activated.

10. The memory device according to claim 2, wherein the data output latch unit further outputs a part of the normal data through rising edge synchronization data output lines in synchronization with a rising edge of the read enable pipe signal, and outputs a remaining part of the normal data through falling edge synchronization data output lines in synchronization with a falling edge of the read enable pipe signal.

11. The memory device according to claim 10, wherein the data output latch unit further outputs the logic data through the rising edge synchronization data output lines other than the falling edge synchronization data output lines in synchronization with the rising edge of the read enable pipe signal.

12. A memory system, comprising:
a memory device configured to output normal data and logic data; and
a memory controller configured to output a read enable signal,
wherein the memory device comprises:
a page buffer group configured to read the normal data from a memory cell array;
a control logic configured to store the logic data;
an input/output circuit configured to generate a read enable pipe signal in synchronization with the read enable signal; and
a pipe latch control unit configured to latch the normal data outputted from the page buffer group and the logic data outputted from the control logic in synchronization with the read enable pipe signal,
wherein the input/output circuit further outputs the normal data in synchronization with both a rising edge and a falling edge of the read enable pipe signal, and
wherein the input/output circuit further outputs the logic data in synchronization with either the rising edge or the falling edge of the read enable pipe signal.

13. The memory system according to claim 12, wherein:
the memory controller further outputs a normal data output command,
the control logic further activates a dummy data enable signal in response to the normal data output command, and
the input/output circuit further activates the read enable pipe signal regardless of the read enable signal while the dummy data enable signal is activated.

14. The memory system according to claim 13, wherein the pipe latch control unit latches a part of the normal data in synchronization with the read enable pipe signal while the dummy data enable signal is activated.

15. The memory system according to claim 14, wherein:
the memory controller further outputs a logic data output command,
the control logic further activates a logic data output enable signal in response to the logic data output command,
the pipe latch control unit further generates a logic data pipe input signal according to activation of the logic data output enable signal, and latches the part of the logic data in response to the logic data pipe input signal.

16. The memory system according to claim 15,
wherein the input/output circuit further generates a rising clock signal in synchronization with the rising edge of the read enable signal and outputs the normal data to the memory controller in synchronization with the rising clock signal while the logic data output enable signal is activated, and
wherein the input/output circuit further generates a falling clock signal in synchronization with the falling edge of the read enable signal and maintains the falling clock signal at a constant value regardless of the read enable signal while the logic data output enable signal is activated.

17. The memory system according to claim 15, wherein the pipe latch control unit further generates a second logic data pipe input signal by time-delaying the logic data pipe input signal, and latches a remaining part of the logic data in response to the second logic data pipe input signal.

18. A method for operating a memory device, comprising:
latching normal data outputted from a memory cell array in response to a read enable pipe signal including a plurality of pulses;
activating a read enable signal;
activating the read enable pipe signal in synchronization with the read enable signal;
outputting the normal data to an outside at a double data rate in synchronization with the read enable signal;
latching logic data outputted from a control logic in response to a logic data pipe input signal; and
outputting the logic data to an outside at a single data rate in synchronization with the read enable signal.

19. The method according to claim 18, wherein:
the plurality of pulses included in the read enable pipe signal are generated in response to a normal data output command before the read enable signal starts to be activated, and
the logic data pipe input signal includes a single pulse generated in response to a logic data output command before the read enable signal starts to be activated.

* * * * *